(12) United States Patent
Raring et al.

(10) Patent No.: US 8,750,342 B1
(45) Date of Patent: Jun. 10, 2014

(54) LASER DIODES WITH SCRIBE STRUCTURES

(75) Inventors: James W. Raring, Fremont, CA (US);
Nick Pfister, Fremont, CA (US);
Yu-Chia Chang, Fremont, CA (US);
Matt Schmidt, Fremont, CA (US);
Drew Felker, Fremont, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 82 days.

(21) Appl. No.: 13/363,935

(22) Filed: Feb. 1, 2012

Related U.S. Application Data

(60) Provisional application No. 61/533,030, filed on Sep. 9, 2011.

(51) Int. Cl.
*H01S 3/08* (2006.01)
*H01S 5/00* (2006.01)

(52) U.S. Cl.
USPC .............................. 372/44.01; 372/98; 372/99

(58) Field of Classification Search
USPC .............................. 372/44.01, 98, 99; 438/42
See application file for complete search history.

(56) References Cited

U.S. PATENT DOCUMENTS

| | | | |
|---|---|---|---|
| 4,318,058 A | 3/1982 | Mito et al. | |
| 4,341,592 A | 7/1982 | Shortes et al. | |
| 4,860,687 A | 8/1989 | Frijlink | |
| 4,911,102 A | 3/1990 | Manabe et al. | |
| 5,073,041 A * | 12/1991 | Rastani | 385/33 |
| 5,331,654 A | 7/1994 | Jewell et al. | |
| 5,334,277 A | 8/1994 | Nakamura | |
| 5,366,953 A | 11/1994 | Char et al. | |
| 5,527,417 A | 6/1996 | Lida et al. | |
| 5,607,899 A | 3/1997 | Yoshida et al. | |
| 5,632,812 A | 5/1997 | Hirabayashi | |
| 5,647,945 A | 7/1997 | Matsuse et al. | |
| 5,696,389 A | 12/1997 | Ishikawa et al. | |
| 5,821,555 A | 10/1998 | Saito et al. | |
| 5,888,907 A | 3/1999 | Tomoyasu et al. | |
| 5,926,493 A | 7/1999 | O'Brien et al. | |
| 5,951,923 A | 9/1999 | Horie et al. | |
| 6,069,394 A | 5/2000 | Hashimoto et al. | |
| 6,072,197 A | 6/2000 | Horino et al. | |
| 6,147,953 A | 11/2000 | Duncan | |
| 6,153,010 A | 11/2000 | Kiyoku et al. | |
| 6,195,381 B1 | 2/2001 | Botez et al. | |

(Continued)

FOREIGN PATENT DOCUMENTS

| | | |
|---|---|---|
| CN | 101009347 | 3/1987 |
| CN | 1538534 | 10/2004 |

(Continued)

OTHER PUBLICATIONS

Adesida et al., 'Characteristics of chemically assisted ion beam etching of gallium nitride', Applied Physics Letters, vol. 65, No. 7, 1994, pp. 889-891.

(Continued)

*Primary Examiner* — Armando Rodriguez
(74) *Attorney, Agent, or Firm* — Kilpatrick Townsend & Stockton LLP

(57) ABSTRACT

A method and device for emitting electromagnetic radiation using semipolar or nonpolar gallium containing substrates is described where the backside of the substrate includes multiple scribes that reduce stray light leaking.

19 Claims, 21 Drawing Sheets

(56) References Cited

U.S. PATENT DOCUMENTS

| | | |
|---|---|---|
| 6,239,454 B1 | 5/2001 | Glew et al. |
| 6,379,985 B1 | 4/2002 | Cervantes et al. |
| 6,451,157 B1 | 9/2002 | Hubacek |
| 6,489,636 B1 | 12/2002 | Goetz et al. |
| 6,586,762 B2 | 7/2003 | Kozaki |
| 6,635,904 B2 | 10/2003 | Goetz et al. |
| 6,639,925 B2 | 10/2003 | Niwa et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,858,882 B2 | 2/2005 | Tsuda et al. |
| 6,920,166 B2 | 7/2005 | Akasaka et al. |
| 7,009,199 B2 | 3/2006 | Hall |
| 7,019,325 B2 | 3/2006 | Li et al. |
| 7,033,858 B2 | 4/2006 | Chai et al. |
| 7,053,413 B2 | 5/2006 | D'Evelyn et al. |
| 7,063,741 B2 | 6/2006 | D'Evelyn |
| 7,128,849 B2 | 10/2006 | Setlur et al. |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,483,468 B2 | 1/2009 | Tanaka |
| 7,489,441 B2 | 2/2009 | Scheible et al. |
| 7,491,984 B2 | 2/2009 | Koike et al. |
| 7,555,025 B2 | 6/2009 | Yoshida |
| 7,598,104 B2 | 10/2009 | Teng et al. |
| 7,691,658 B2 | 4/2010 | Kaeding et al. |
| 7,709,284 B2 | 5/2010 | Iza et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,017,932 B2 | 9/2011 | Okamoto et al. |
| 8,044,412 B2 | 10/2011 | Murphy et al. |
| 8,124,996 B2 | 2/2012 | Raring et al. |
| 8,126,024 B1 | 2/2012 | Raring |
| 8,143,148 B1 | 3/2012 | Raring et al. |
| 8,242,522 B1 | 8/2012 | Raring |
| 8,247,887 B1 | 8/2012 | Raring et al. |
| 8,252,662 B1 | 8/2012 | Poblenz et al. |
| 8,254,425 B1 | 8/2012 | Raring |
| 8,259,769 B1 | 9/2012 | Raring et al. |
| 8,284,810 B1 | 10/2012 | Sharma et al. |
| 8,294,179 B1 | 10/2012 | Raring |
| 8,314,429 B1 | 11/2012 | Raring et al. |
| 8,350,273 B2 | 1/2013 | Vielemeyer |
| 8,351,478 B2 | 1/2013 | Raring et al. |
| 8,355,418 B2 | 1/2013 | Raring et al. |
| 8,416,825 B1 | 4/2013 | Raring |
| 8,422,525 B1 | 4/2013 | Raring et al. |
| 8,427,590 B2 | 4/2013 | Raring et al. |
| 8,451,876 B1 | 5/2013 | Raring et al. |
| 2001/0048114 A1 | 12/2001 | Morita et al. |
| 2002/0027933 A1 | 3/2002 | Tanabe et al. |
| 2002/0050488 A1 | 5/2002 | Nikitin et al. |
| 2002/0085603 A1 | 7/2002 | Okumura |
| 2002/0105986 A1 | 8/2002 | Yamasaki |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0129810 A1 | 7/2003 | Barth et al. |
| 2003/0140846 A1 | 7/2003 | Biwa et al. |
| 2003/0178617 A1 | 9/2003 | Appenzeller et al. |
| 2003/0200931 A1 | 10/2003 | Goodwin |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0099213 A1 | 5/2004 | Adomaitis et al. |
| 2004/0104391 A1 | 6/2004 | Maeda et al. |
| 2004/0146264 A1 | 7/2004 | Auner et al. |
| 2004/0151222 A1 | 8/2004 | Sekine |
| 2004/0196877 A1 | 10/2004 | Kawakami et al. |
| 2004/0222357 A1 | 11/2004 | King et al. |
| 2004/0233950 A1 | 11/2004 | Furukawa et al. |
| 2004/0247275 A1 | 12/2004 | Vakhshoori et al. |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0168564 A1 | 8/2005 | Kawaguchi et al. |
| 2005/0214992 A1 | 9/2005 | Chakraborty et al. |
| 2005/0218413 A1 | 10/2005 | Matsumoto et al. |
| 2005/0224826 A1 | 10/2005 | Keuper et al. |
| 2005/0229855 A1 | 10/2005 | Raaijmakers |
| 2005/0230701 A1 | 10/2005 | Huang |
| 2005/0247260 A1 | 11/2005 | Shin et al. |
| 2005/0285128 A1 | 12/2005 | Scherer et al. |
| 2005/0286591 A1 | 12/2005 | Lee |
| 2006/0030738 A1 | 2/2006 | Vanmaele et al. |
| 2006/0033009 A1 | 2/2006 | Kobayashi et al. |
| 2006/0037529 A1 | 2/2006 | D'Evelyn |
| 2006/0038193 A1 | 2/2006 | Wu et al. |
| 2006/0060131 A1 | 3/2006 | Atanackovic |
| 2006/0066319 A1 | 3/2006 | Dallenbach et al. |
| 2006/0077795 A1 | 4/2006 | Kitahara et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0213429 A1 | 9/2006 | Motoki et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0101932 A1 | 5/2007 | Schowalter et al. |
| 2007/0110112 A1 | 5/2007 | Sugiura |
| 2007/0120141 A1 | 5/2007 | Moustakas et al. |
| 2007/0153866 A1 | 7/2007 | Shchegrov et al. |
| 2007/0163490 A1 | 7/2007 | Habel et al. |
| 2007/0166853 A1 | 7/2007 | Guenther et al. |
| 2007/0184637 A1 | 8/2007 | Haskell et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0259464 A1 | 11/2007 | Bour et al. |
| 2007/0272933 A1 | 11/2007 | Kim et al. |
| 2007/0280320 A1 | 12/2007 | Feezell et al. |
| 2008/0029152 A1 | 2/2008 | Milshtein et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1 | 8/2008 | Nakamura et al. |

(56) References Cited

U.S. PATENT DOCUMENTS

| | | |
|---|---|---|
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0273562 A1* | 11/2008 | Hasegawa et al. ......... 372/44.01 |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0058532 A1 | 3/2009 | Kikkawa et al. |
| 2009/0061857 A1 | 3/2009 | Kazmi |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0310640 A1 | 12/2009 | Sato et al. |
| 2009/0316116 A1 | 12/2009 | Melville et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006546 A1 | 1/2010 | Young et al. |
| 2010/0006873 A1 | 1/2010 | Raring et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0096615 A1 | 4/2010 | Okamoto et al. |
| 2010/0104495 A1 | 4/2010 | Kawabata et al. |
| 2010/0140630 A1 | 6/2010 | Hamaguchi et al. |
| 2010/0140745 A1 | 6/2010 | Khan et al. |
| 2010/0151194 A1 | 6/2010 | D'Evelyn |
| 2010/0195687 A1 | 8/2010 | Okamoto et al. |
| 2010/0220262 A1 | 9/2010 | DeMille et al. |
| 2010/0276663 A1 | 11/2010 | Enya et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0031508 A1 | 2/2011 | Hamaguchi et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0073888 A1 | 3/2011 | Ueno et al. |
| 2011/0075694 A1 | 3/2011 | Yoshizumi et al. |
| 2011/0103418 A1 | 5/2011 | Hardy et al. |
| 2011/0129669 A1 | 6/2011 | Fujito et al. |
| 2011/0150020 A1 | 6/2011 | Haase et al. |
| 2011/0164637 A1 | 7/2011 | Yoshizumi et al. |
| 2011/0180781 A1 | 7/2011 | Raring et al. |
| 2011/0182056 A1 | 7/2011 | Trottier et al. |
| 2011/0186874 A1 | 8/2011 | Shum |
| 2011/0186887 A1 | 8/2011 | Trottier et al. |
| 2011/0188530 A1 | 8/2011 | Lell et al. |
| 2011/0216795 A1 | 9/2011 | Hsu et al. |
| 2011/0247556 A1 | 10/2011 | Raring et al. |
| 2011/0281422 A1 | 11/2011 | Wang et al. |
| 2011/0286484 A1 | 11/2011 | Raring et al. |
| 2012/0104359 A1 | 5/2012 | Felker et al. |
| 2012/0178198 A1 | 7/2012 | Raring et al. |
| 2012/0187371 A1 | 7/2012 | Raring et al. |
| 2012/0314398 A1 | 12/2012 | Raring et al. |
| 2013/0016750 A1 | 1/2013 | Raring et al. |
| 2013/0022064 A1 | 1/2013 | Raring et al. |
| 2013/0044782 A1 | 2/2013 | Raring |
| 2013/0064261 A1 | 3/2013 | Sharma et al. |

FOREIGN PATENT DOCUMENTS

| | | |
|---|---|---|
| CN | 1702836 | 11/2005 |
| CN | 1781195 | 5/2006 |
| CN | 101079463 | 11/2007 |
| CN | 101099245 | 1/2008 |
| CN | 101171692 | 4/2008 |
| CN | 101079463 | 9/2009 |
| JP | 3-287770 | 12/1991 |
| JP | 2007-173467 A | 7/2007 |
| JP | 2007-068398 | 4/2008 |
| WO | WO 2004/084275 | 9/2004 |
| WO | WO2008-041521 | 4/2008 |
| WO | WO 2010/120819 | 10/2010 |

OTHER PUBLICATIONS

Behfar et al., 'Progress in Etched Facet Technology for GaN and Blue Lasers', Proc. of SPIE., vol. 6473, 64731F, 2007, pp. 1-8.
International Preliminary Report & Written Opinion of PCT Application No. PCT/US2011/060030 dated Mar. 21, 2012, 11 pgs. total.
USPTO Notice of Allowance for U.S. Appl. No. 12/749,466 dated Jan. 2, 2013.
USPTO Office Action for U.S. Appl. No. 12/787,343 dated Dec. 17, 2012.
USPTO Notice of Allowance for U.S. Appl. No. 12/787,343 dated Jun. 10, 2013.
USPTO Notice of Allowance for U.S. Appl. No. 12/789,303 dated Dec. 21, 2012.
USPTO Office Action for U.S. Appl. No. 12/868,441 dated Dec. 18, 2012.
USPTO Office Action for U.S. Appl. No. 13/114,806 dated Apr. 12, 2013.
USPTO Office Action for U.S. Appl. No. 13/291,922 dated Jun. 18, 2013.
USPTO Office Action for U.S. Appl. No. 13/548,635 dated Jun. 14, 2013.
USPTO Notice of Allowance for U.S. Appl. No. 13/606,894 dated May 24, 2013.
USPTO Notice of Allowance for U.S. Appl. No. 12/502,058 dated Jul. 19, 2012.
USPTO Office Action for U.S. Appl. No. 12/749,466 dated Jul. 3, 2012.
USPTO Notice of Allowance for U.S. Appl. No. 12/749,476 dated Jun. 26, 2012.
USPTO Office Action for U.S. Appl. No. 12/759,273 dated Jun. 26, 2012.
USPTO Notice of Allowance for U.S. Appl. No. 12/762,271 dated Aug. 8, 2012.
USPTO Notice of Allowance for U.S. Appl. No. 12/880,803 dated Jul. 18, 2012.
USPTO Office Action for U.S. Appl. No. 12/883,093 dated Aug. 3, 2012.
USPTO Office Action for U.S. Appl. No. 12/884,993 dated Aug. 2, 2012.
USPTO Office Action for U.S. Appl. No. 12/995,946 dated Mar. 28, 2012.
USPTO Office Action for U.S. Appl. No. 13/046,565 dated Jul. 19, 2012.
U.S. Appl. No. 12/497,289, filed Jul. 2, 2009, Raring et al.
Abare "Cleaved and Etched Facet Nitride Laser Diodes," IEEE Journal of Selected Topics in Quantum Electronics, vol. 4, No. 3, pp. 505-509 (May 1998).

(56) References Cited

OTHER PUBLICATIONS

Aoki et al., "InGaAs/InGaAsP MQW Electroabsorption Modulator Integrated with a DFB Laser Fabricated by Band-Gap Energy Control Selective Area MOCVD, 1993,"IEEE J Quantum Electronics, vol. 29, pp. 2088-2096.
Asano et al., "100-mW kink-Free Blue-Violet Laser Diodes with Low Aspect Ratio," 2003, IEEE Journal of Quantum Electronics, vol. 39, No. 1, pp. 135-140.
Asif Khan "Cleaved cavity optically pumped InGaN-GaN laser grown on spinel substrates," Appl. Phys. Lett. 69 (16), pp. 2418-2420 (Oct. 14, 1996).
Bernardini et al., "Spontaneous Polarization and Piezoelectric Constants of III-V Nitrides," 1997, Physical Review B, vol. 56, No. 16, pp. 10024-10027.
Caneau et al., "Studies on Selective OMVPE of (Ga,In)/(As,P)," 1992, Journal of Crystal Growth, vol. 124, pp. 243-248.
Chen et al., "Growth and Optical Properties of Highly Uniform and Periodic InGaN Nanostructures," 2007, Advanced Materials, vol. 19, pp. 1707-1710.
D'Evelyn et al., "Bulk GaN Crystal Growth by the High-Pressure Ammonothermal Method," Journal of Crystal Growth, 2007, vol. 300, pp. 11-16.
Fujii et al., "Increase in the Extraction Efficiency of GaN-based Light-Emitting Diodes Via Surface Roughening," 2004, Applied Physics Letters, vol. 84, No. 6, pp. 855-857.
Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.
Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.
Gardner et al. "Blue-emitting InGaN-GaN double-heterostructure light-emitting diodes reaching maximum quantum efficiency above 200 A/ cm2", Applied Physics Letters 91, 243506 (2007).
hap ://techon.nikkeibp. co jp/english/NEWS_EN/20080122/146009.
Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.
Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.
Kendall et al., "Energy Savings Potential of Solid State Lighting in General Lighting Applications," 2001, Report for the Department of Energy, pp. 1-35.
Kim et al, "Improved Electroluminescence on Nonpolar m-plane InGaN/GaN Qantum Well LEDs", 2007, Physica Status Solidi (RRL), vol. 1, No. 3, pp. 125-127.
Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.
Lin et al."Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).
Masui et al. "Electrical Characteristics of Nonpolar InGaN-Based Light-Emitting Diodes Evaluated at Low Temperature," Jpn. J. Appl. Phys. 46 pp. 7309-7310 (2007).
Michiue et al. "Recent development of nitride LEDs and LDs," Proceedings of SPIE, vol. 7216, 72161Z (2009).
Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.
Nam et al., "Later Epitaxial Overgrowth of GaN films on SiO2 Areas Via Metalorganic Vapor Phase Epitaxy," 1998, Journal of Electronic Materials, vol. 27, No. 4, pp. 233-237.

Okamoto et al. in "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).
Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.
Okamoto et. al "Continuous-Wave Operation of m-Plane InGaN Multiple Quantum Well Laser Diodes" The Japan Society of I Applied Physics JJAP Express LEtter, vol. 46, No. 9, 2007 pp. L 187-L 189.
Park, "Crystal orientation effects on electronic properties of wurtzite InGaN/GaN quantum wells,",Journal of Applied Physics vol. 91, No. 12, pp. 9904-9908 (Jun. 2002).
Purvis, "Changing the Crystal Face of Gallium Nitride." The Advance Semiconductor Magazine, vol. 18, No. 8, Nov. 2005.
Romanov "Strain-induced polarization in wurtzite III-nitride semipolar layers," Journal of Applied Physics 100, pp. 023522-1 through 023522-10 (Jul. 25, 2006).
Sato et al., "High Power and High Efficiency Green Light Emitting Diode on free-Standing Semipolar (1122) Bulk GaN Substrate," 2007.Physica Status Solidi (RRL), vol. 1, pp. 162-164.
Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.
Schmidt et al., "Demonstration of Nonpolar m-plane InGaN/GaN Laser Diodes," 2007, Journal of Japanese Applied Physics, vol. 46, No. 9, pp. 190-191.
Schmidt et al., "High Power and High External Efficiency m-plane InGaN Light Emitting Diodes," 2007, Japanese Journal of Applied Physics, vol. 46, No. 7, pp. L126-L128.
Schoedl "Facet degradation of GaN heterostructure laser diodes," Journal of Applied Physics vol. 97, issue 12, pp. 123102-1 to 123102-8 (2005).
Shchekin et al., "High Performance Thin-film Flip-Chip InGaN-GaN Light-emitting Diodes," 2006, Applied Physics Letters, vol. 89, pp. 071109-071109-3.
Shen et al. "Auger recombination in InGaN measured by photoluminescence," Applied Physics Letters, 91, 141101 (2007).
Sizov et al., "500-nm Optical Gain Anisotropy of Semipolar (1122) InGaN Quantum Wells," 2009, Applied Physics Express, vol. 2, pp. 071001-1-071001-3.
Tomiya et. al. Dislocation related issues in the degradation of GaN-based laser diodes, IEEE Journal of Selected Topics in Quantum Electronics vol. 10, No. 6 (2004).
Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.
Uchida et al.,"Recent Progress in High-Power Blue-violet Lasers," 2003, IEEE Journal of Selected Topics in Quantum Electronics, vol. 9, No. 5, pp. 1252-1259.
Waltereit et al., "Nitride Semiconductors Free of Electrostatic Fields for Efficient White Light-emitting Diodes," 2000, Nature: International Weekly Journal of Science, vol. 406, pp. 865-868.
Wierer et al., "High-power AlGaInN Flip-chip Light-emitting Diodes," 2001, Applied Physics Letters, vol. 78, No. 22, pp. 3379-3381.
Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.
Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.
Zhong et al., "Demonstration of High Power Blue-Green Light Emitting Diode on Semipolar (1122) Bulk GaN Substrate," 2007, Electron Letter, vol. 43, No. 15, pp. 825-826.
Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

(56) References Cited

OTHER PUBLICATIONS

International Preliminary Report & Written Opinion of PCT Application No. PCT/US2011/037792, dated Sep. 8, 2011, 13 pages total.
Tyagi et al., 'Semipolar (1011) InGaN/GaN Laser Diodes on Bulk GaN Substrates,' Japanese Journal of Applied Physics, vol. 46, No. 19, 2007, pp. L444-L445.
USPTO Office Action for U.S. Appl. No. 12/995,946 dated Jan. 29, 2013.
USPTO Office Action for U.S. Appl. No. 12/534,838 dated May 3, 2011.
USPTO Office Action for U.S. Appl. No. 12/534,838 dated Jan. 13, 2012.
USPTO Office Action for U.S. Appl. No. 12/534,838 dated Mar. 20, 2012.
USPTO Notice of Allowance for U.S. Appl. No. 12/534,838 dated Jun. 8, 2012.
USPTO Office Action for U.S. Appl. No. 12/859,153 dated Feb. 26, 2013.
USPTO Office Action for U.S. Appl. No. 12/942,817 dated Feb. 20, 2013.
USPTO Notice of Allowance for U.S. Appl. No. 13/108,645 dated Jan. 28, 2013.
USPTO Office Action for U.S. Appl. No. 13/291,922 dated Feb. 20, 2013.
USPTO Office Action for U.S. Appl. No. 13/425,354 dated Feb. 14, 2013.
USPTO Office Action for U.S. Appl. No. 13/548,312 dated Mar. 12, 2013.
USPTO Office Action for U.S. Appl. No. 13/606,894 dated Feb. 5, 2013.
Founta et al., 'Anisotropic Morphology of Nonpolar a-Plane GaN Quantum Dots and Quantum Wells,' Journal of Applied Physics, vol. 102, 2007, pp. 074304-1-074304-6.
USPTO Office Action for U.S. Appl. No. 12/481,543 dated Jun. 27, 2011.
USPTO Office Action for U.S. Appl. No. 12/482,440 dated Feb. 23, 2011.
USPTO Office Action for U.S. Appl. No. 12/482,440 dated Aug. 12, 2011.
USPTO Office Action for U.S. Appl. No. 12/484,924 dated Apr. 14, 2011.
USPTO Office Action for U.S. Appl. No. 12/491,169 dated Oct. 22, 2010.
USPTO Office Action for U.S. Appl. No. 12/491,169 dated May 11, 2011.
USPTO Notice of Allowance for U.S. Appl. No. 12/497,289 dated May 22, 2012.
USPTO Office Action for U.S. Appl. No. 12/502,058 dated Dec. 8, 2010.
USPTO Office Action for U.S. Appl. No. 12/502,058 dated Aug. 19, 2011.
USPTO Notice of Allowance for U.S. Appl. No. 12/502,058 dated Apr. 16, 2012.
USPTO Office Action for U.S. Appl. No. 12/534,829 dated Apr. 19, 2011.
USPTO Notice of Allowance for U.S. Appl. No. 12/534,829 dated Oct. 28, 2011.
USPTO Notice of Allowance for U.S. Appl. No. 12/534,829 dated Dec. 5, 2011.
USPTO Notice of Allowance for U.S. Appl. No. 12/534,829 dated Dec. 21, 2011.
USPTO Office Action for U.S. Appl. No. 12/573,820 dated Mar. 2, 2011.
USPTO Office Action for U.S. Appl. No. 12/573,820 dated Oct. 11, 2011.
USPTO Office Action for U.S. Appl. No. 12/749,466 dated Jun. 29, 2011.
USPTO Office Action for U.S. Appl. No. 12/749,476 dated Apr. 11, 2011.
USPTO Office Action for U.S. Appl. No. 12/749,476 dated Nov. 8, 2011.
USPTO Notice of Allowance for U.S. Appl. No. 12/749,476 dated May 4, 2012.
USPTO Notice of Allowance for U.S. Appl. No. 12/762,269 dated Apr. 23, 2012.
USPTO Office Action for U.S. Appl. No. 12/762,271 dated Jun. 6, 2012.
USPTO Notice of Allowance for U.S. Appl. No. 12/778,718 dated Apr. 3, 2012.
USPTO Notice of Allowance for U.S. Appl. No. 12/778,718 dated Jun. 13, 2012.
USPTO Office Action for U.S. Appl. No. 12/868,441 dated Apr. 30, 2012.
USPTO Office Action for U.S. Appl. No. 12/880,803 dated Feb. 22, 2012.
USPTO Office Action for U.S. Appl. No. 12/883,093 dated Mar. 13, 2012.
USPTO Office Action for U.S. Appl. No. 12/883,652 dated Apr. 17, 2012.
USPTO Office Action for U.S. Appl. No. 12/884,993 dated Mar. 16, 2012.
USPTO Office Action for U.S. Appl. No. 13/014,622 dated Nov. 28, 2011.
USPTO Office Action for U.S. Appl. No. 13/014,622 dated Apr. 30, 2012.
USPTO Office Action for U.S. Appl. No. 13/046,565 dated Apr. 13, 2012.
Chinese Office Action From Chinese Patent Application No. 200980134723.8 dated Nov. 1, 2012, 22 pgs. (With Translation).
Franssila, 'Tools for CVD and Epitaxy', Introduction to Microfabrication, 2004, pp. 329-336.
USPTO Office Action for U.S. Appl. No. 12/789,303 dated Sep. 24, 2012.
USPTO Office Action for U.S. Appl. No. 12/859,153 dated Sep. 25, 2012.
USPTO Notice of Allowance for U.S. Appl. No. 12/883,093 dated Nov. 21, 2012.
USPTO Notice of Allowance for U.S. Appl. No. 12/884,993 dated Nov. 26, 2012.
USPTO Office Action for U.S. Appl. No. 13/354,639 dated Nov. 7, 2012.
USPTO Notice of Allowance for U.S. Appl. No. 13/354,639 dated Dec. 14, 2012.
International Search Report of PCT Application No. PCT/US2009/047107, dated Sep. 29, 2009, 4 pages total.
International Search Report of PCT Application No. PCT/US2009/046786, dated May 13, 2010, 2 pages total.
International Search Report of PCT Application No. PCT/US2009/52611, dated Sep. 29, 2009, 3 pages total.
International Search Report & Written Opinion of PCT Application No. PCT/US2010/030939, dated Jun. 16, 2010, 9 pages total.
International Search Report & Written Opinion of PCT Application No. PCT/US2010/049172, dated Nov. 17, 2010, 7 pages total.
International Search Report of PCT Application No. PCT/US2011/037792, dated Sep. 8, 2011, 2 pages total.
Yoshizumi et al., 'Continuous-Wave Operation of 520 nm Green InGaN-Based Laser Diodes on Semi-Polar {2021} GaN Substrates,' Applied Physics Express, vol. 2, 2009, pp. 092101-1-092101-3.
USPTO Office Action for U.S. Appl. No. 12/484,924 dated Oct. 31, 2011.
USPTO Office Action for U.S. Appl. No. 12/497,289 dated Feb. 2, 2012.
USPTO Office Action for U.S. Appl. No. 12/749,466 dated Feb. 3, 2012.
USPTO Office Action for U.S. Appl. No. 12/759,273 dated Nov. 21, 2011.
USPTO Office Action for U.S. Appl. No. 12/762,269 dated Oct. 12, 2011.
USPTO Office Action for U.S. Appl. No. 12/762,271 dated Dec. 23, 2011.
USPTO Notice of Allowance for U.S. Appl. No. 12/762,278 dated Nov. 7, 2011.

(56) References Cited

OTHER PUBLICATIONS

USPTO Office Action for U.S. Appl. No. 12/778,718 dated Nov. 25, 2011.
USPTO Office Action for U.S. Appl. No. 13/046,565 dated Nov. 7, 2011.
USPTO Office Action for U.S. Appl. No. 13/046,565 dated Feb. 2, 2012.
Feezell et al. 'Development of nonpolar and semipolar InGaN/GaN visible light-emitting diodes', MRS Bulletin, vol. 34, May 2009, pp. 318-323.
International Search Report of PCT Application No. PCT/US2010/030939, dated Jun. 16, 2010, 9 pages total.
Communication from the Chinese Patent Office re 200980134723.8 dated Jun. 27, 2013, 19 pages.
USPTO Notice of Allowance for U.S. Appl. No. 12/868,441 dated Sep. 18, 2013, 13 pages.
USPTO Office Action for U.S. Appl. No. 13/114,806 dated Aug. 26, 2013, 22 pages.

\* cited by examiner

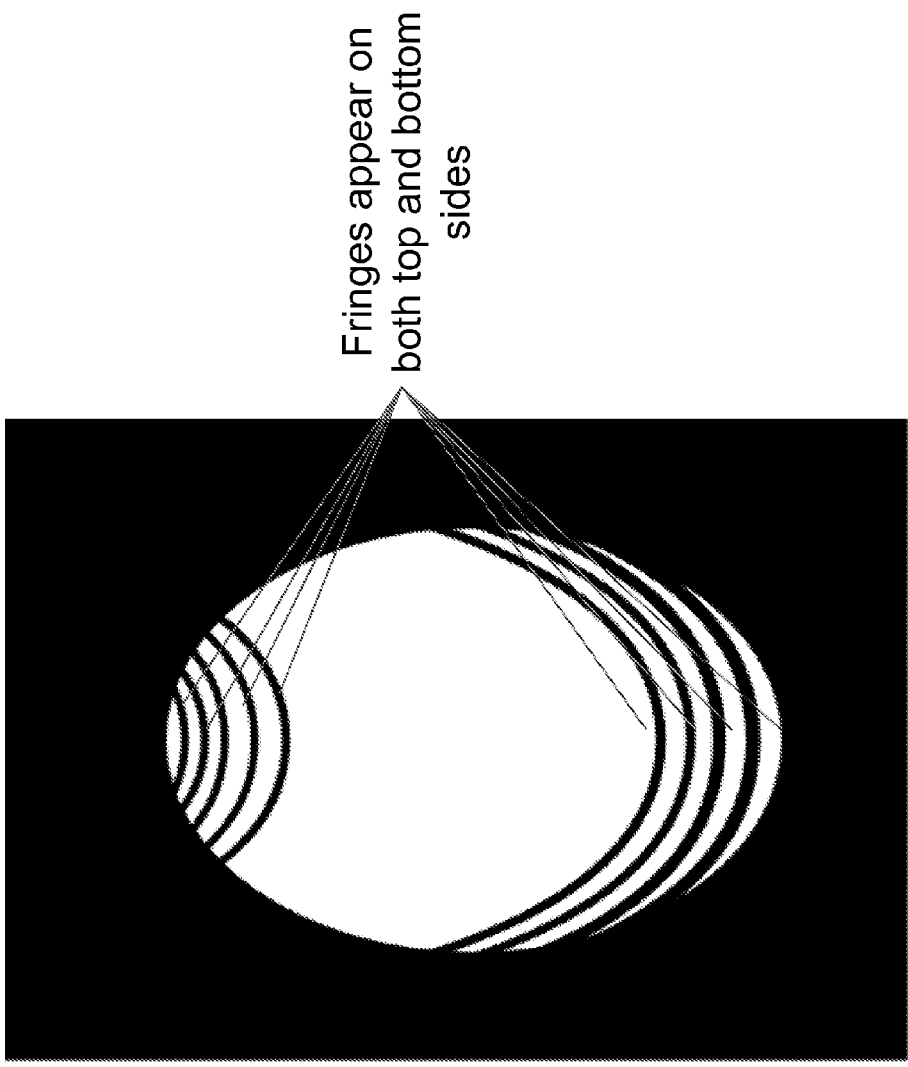

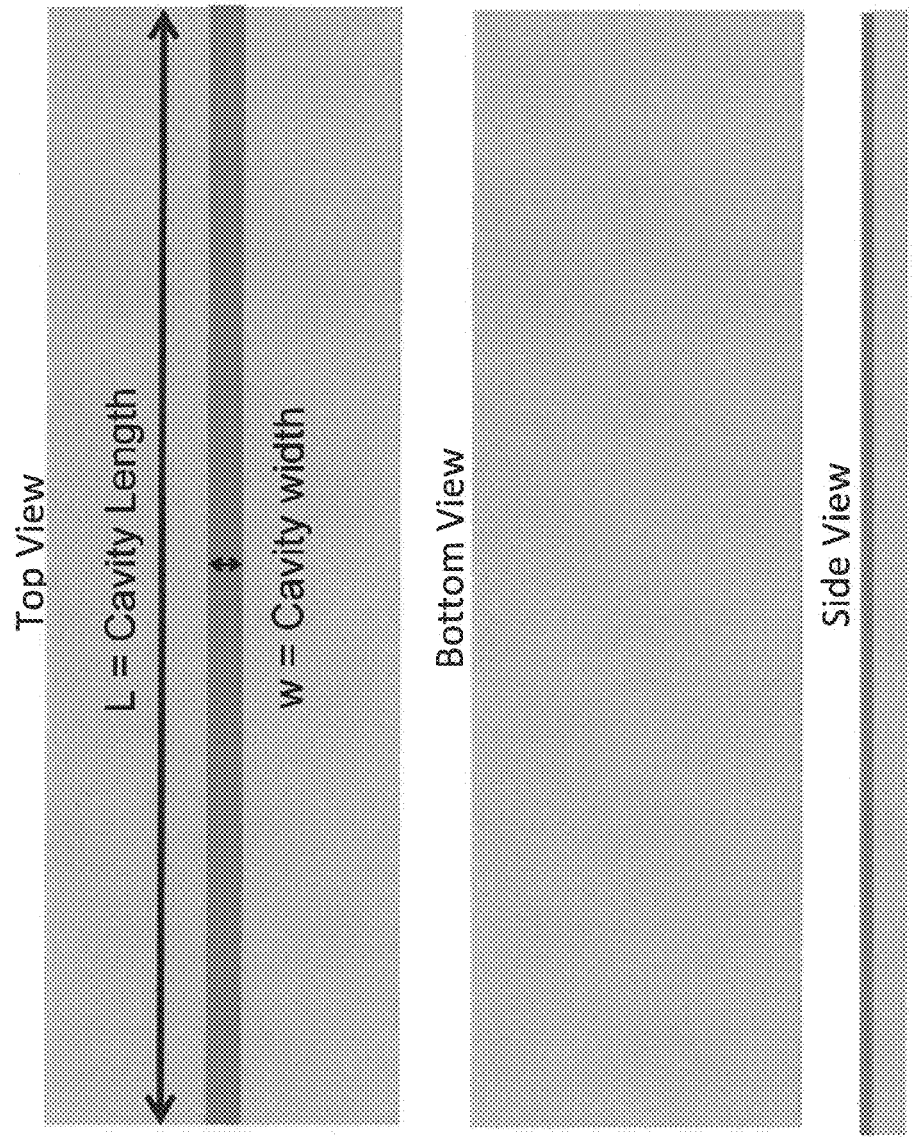

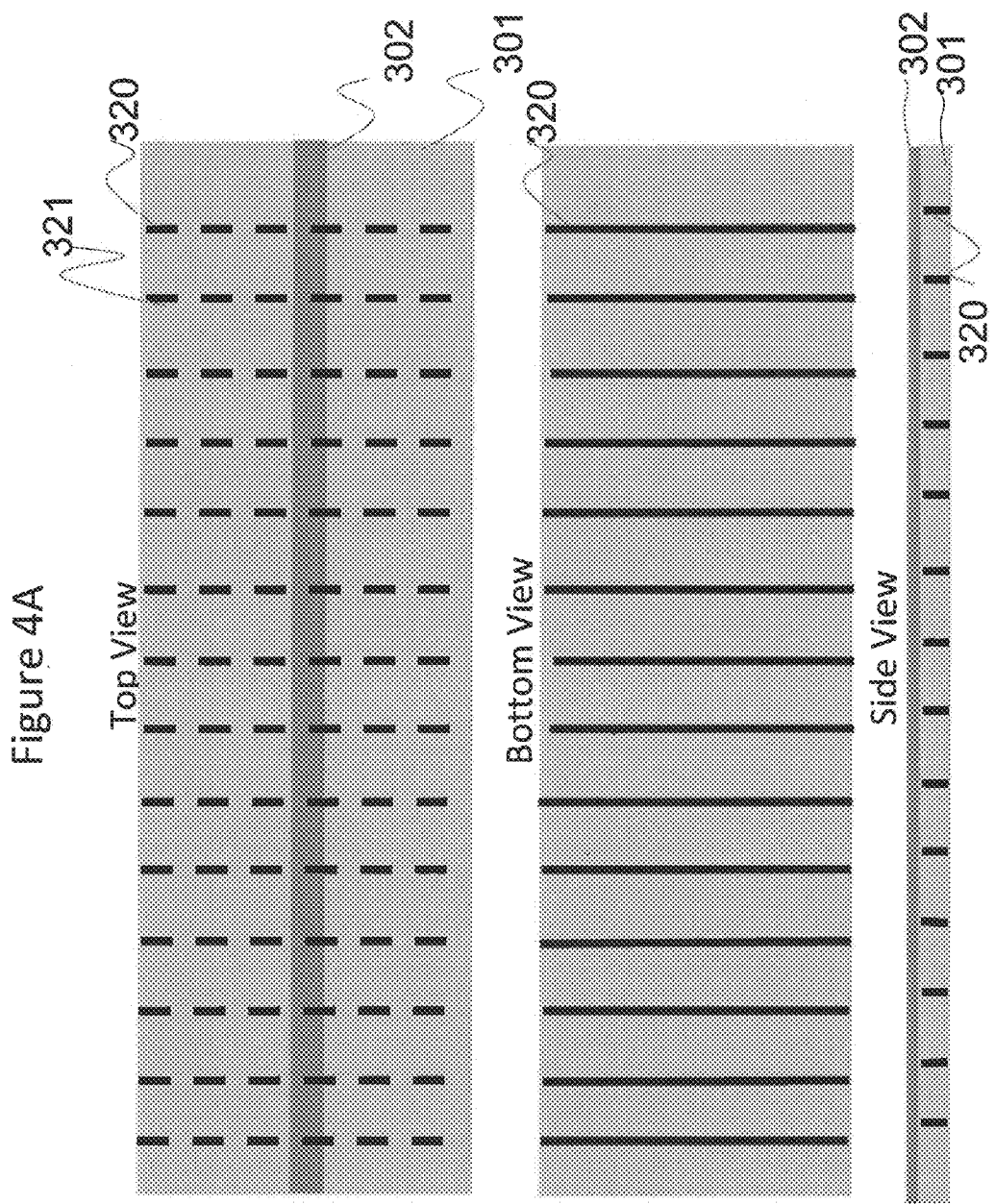

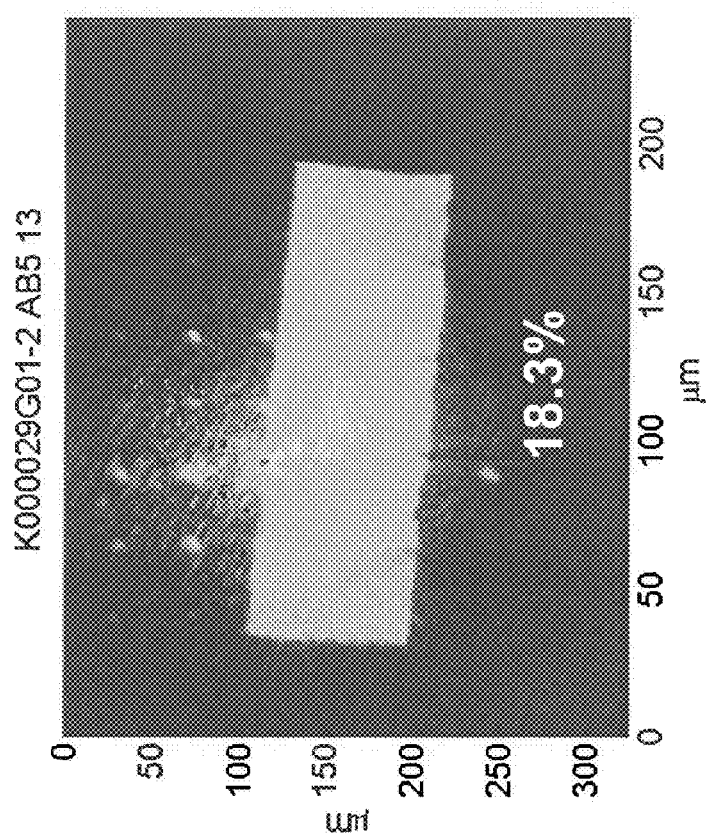

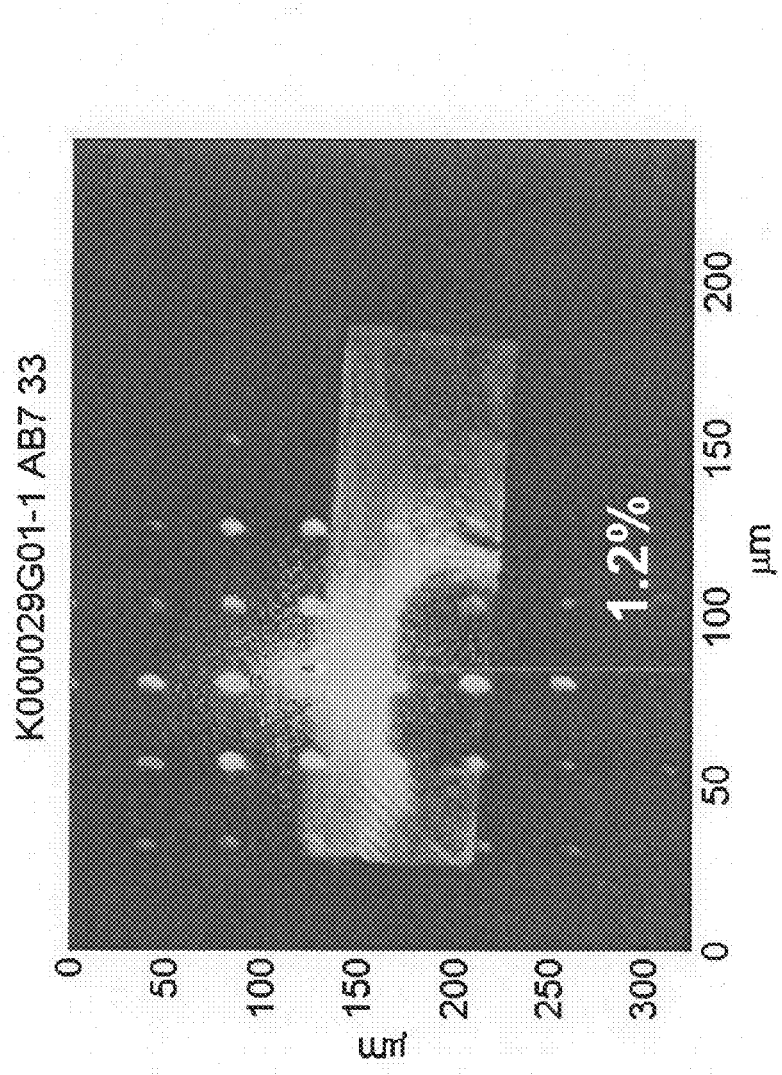
Figure 7: Near field images With scribes

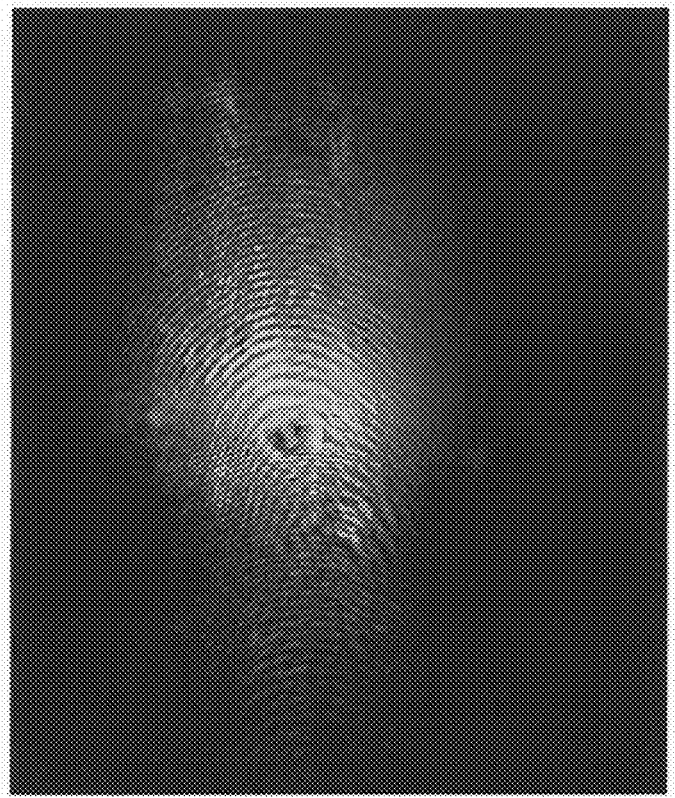
Figure 8: Far-field images— No scribes

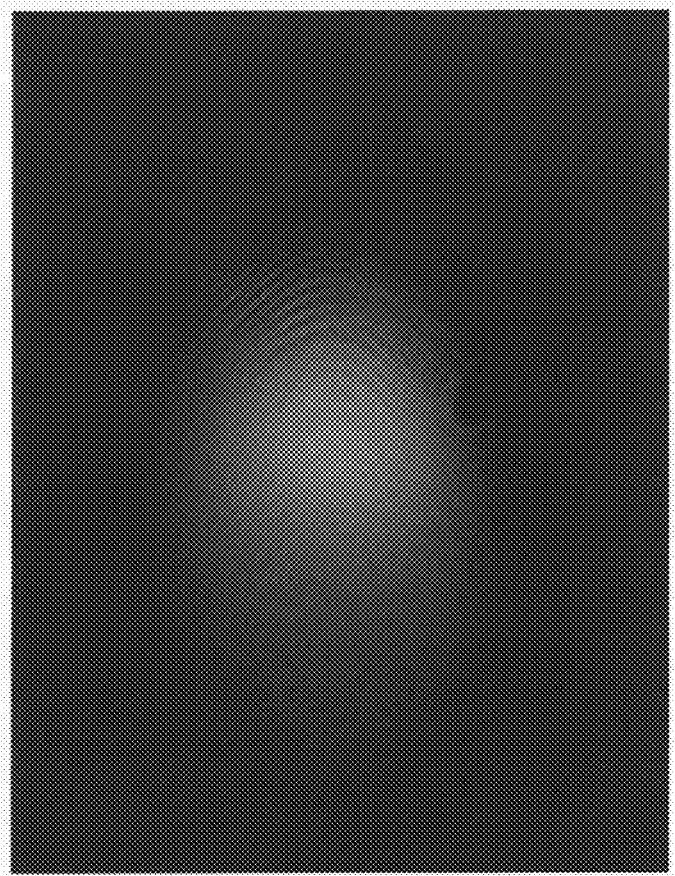
Figure 9: Far-field images— With scribes

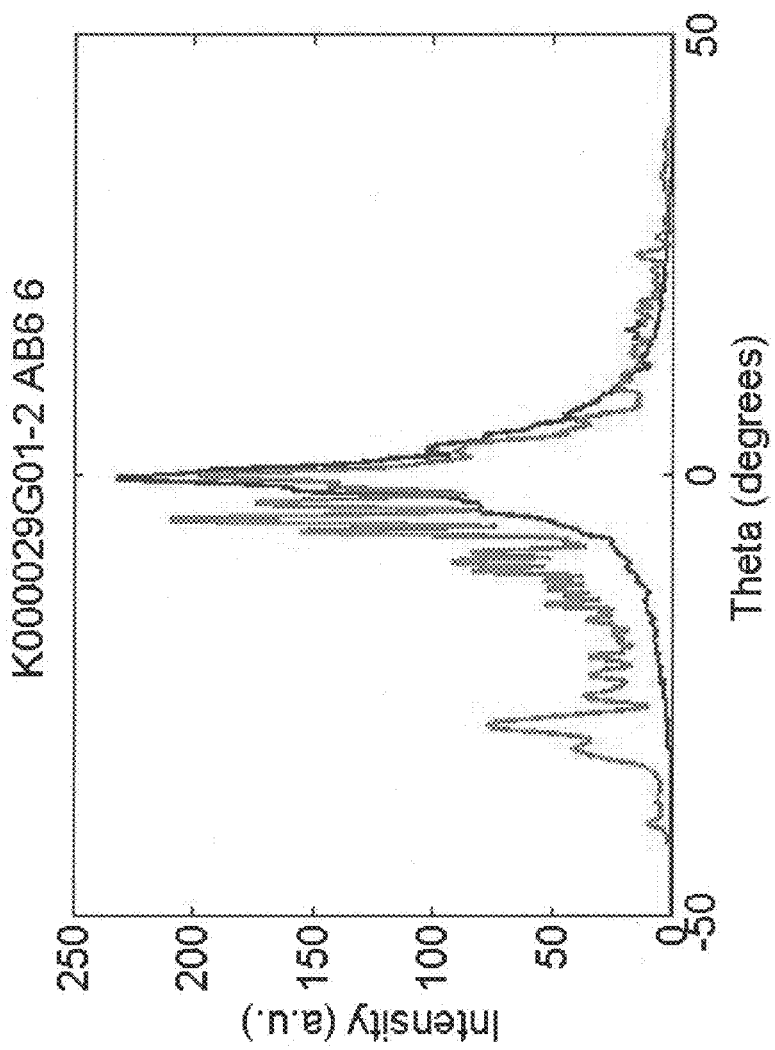
Figure 10: Far-field traces – No scribes

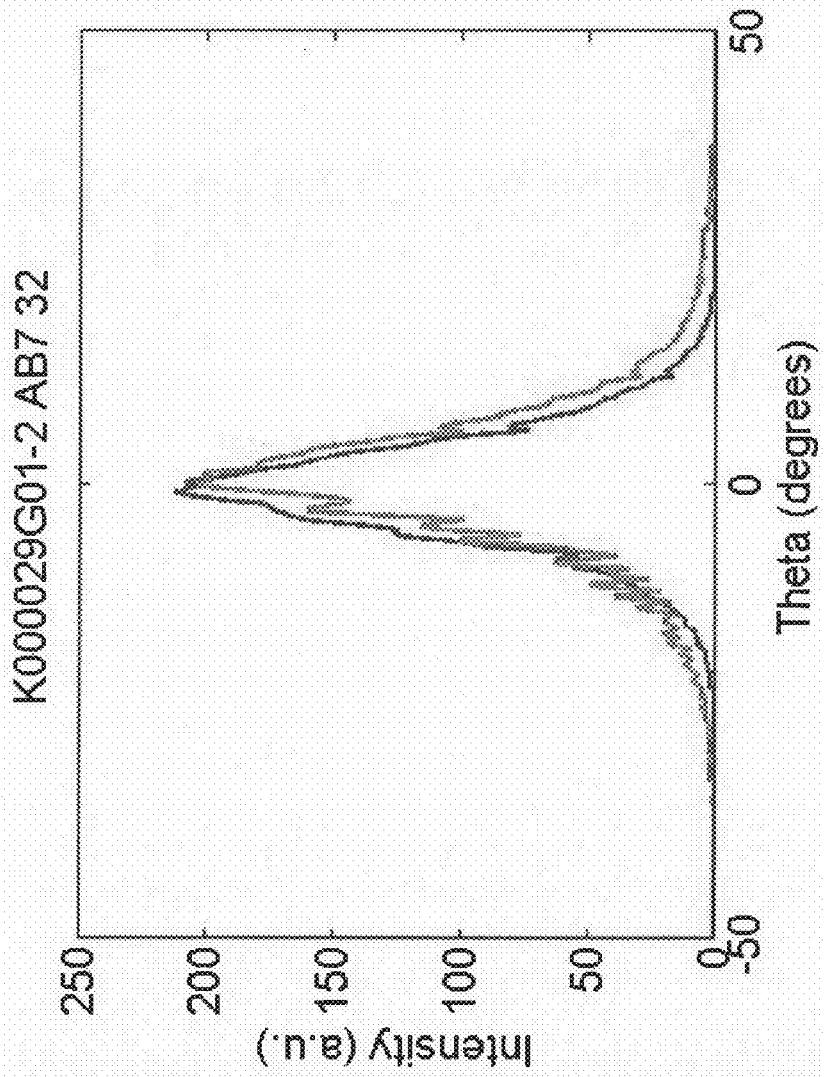

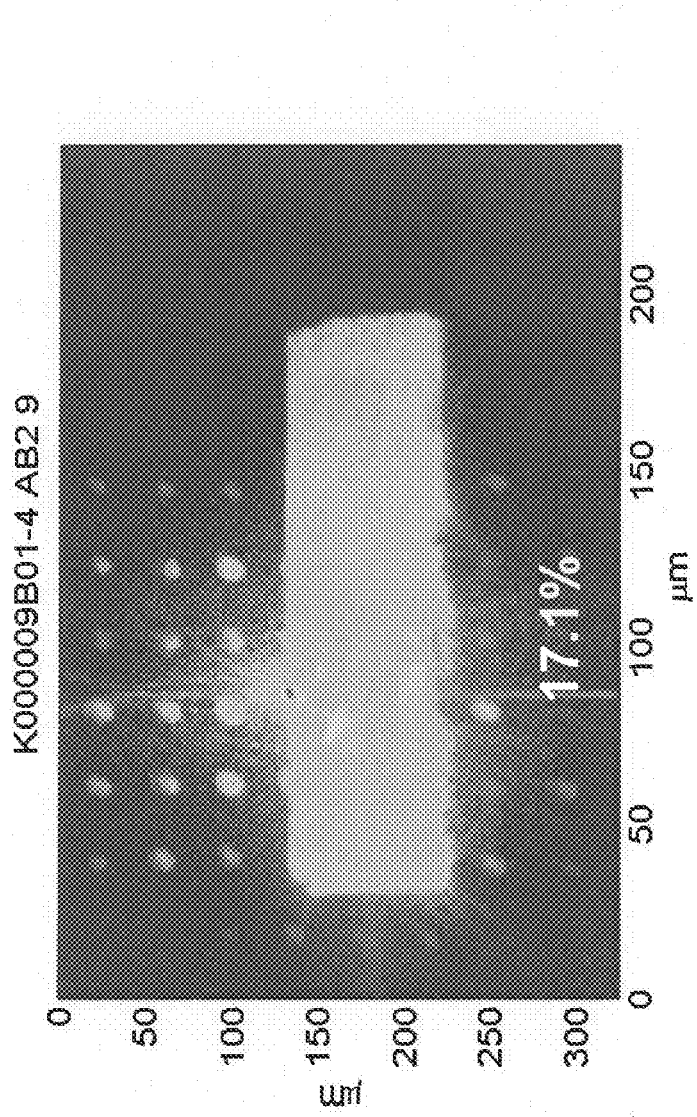
Figure 12: Near field images – No scribes

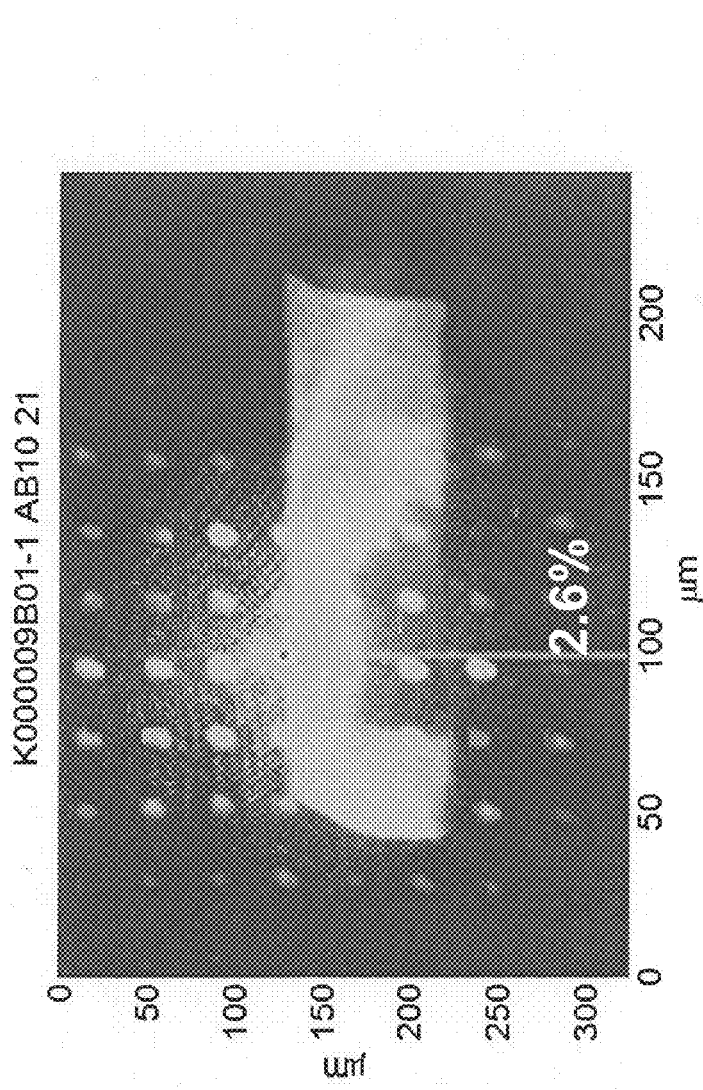
Figure 13: Near field images – With scribes

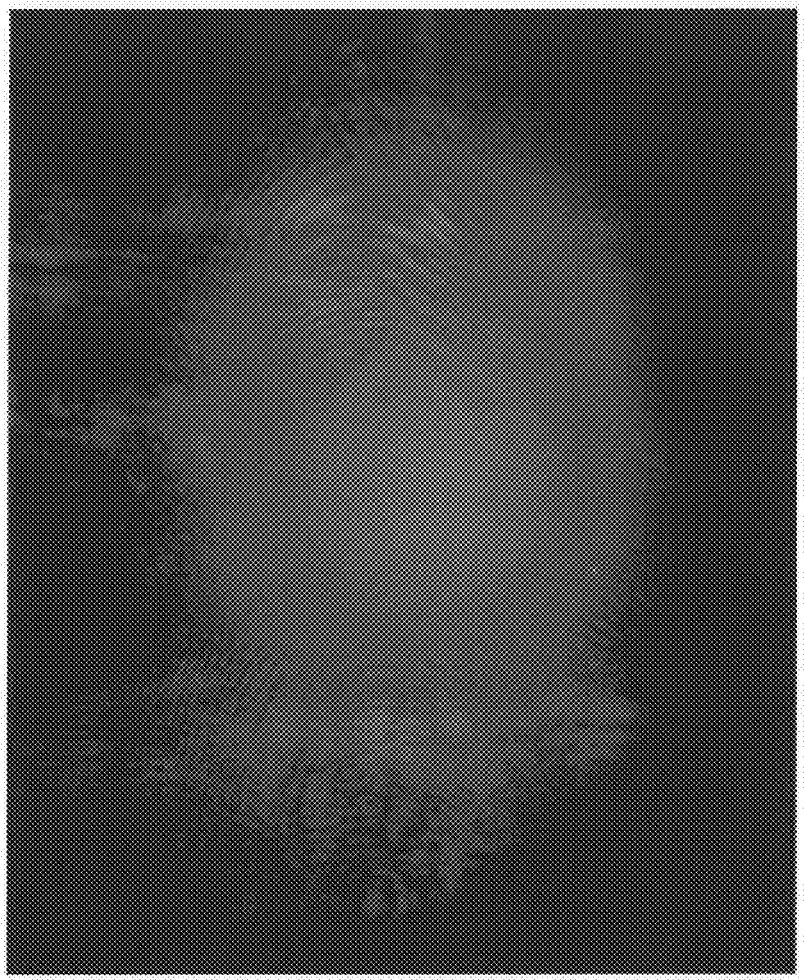
Figure 14: Far-field images – No scribes

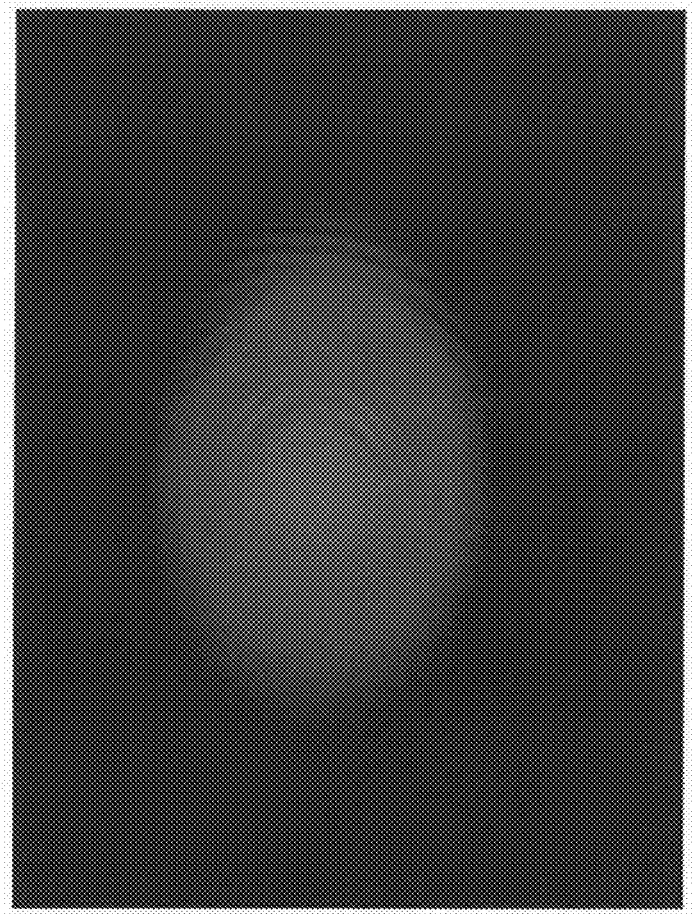
Figure 15: Far-field images – With scribes

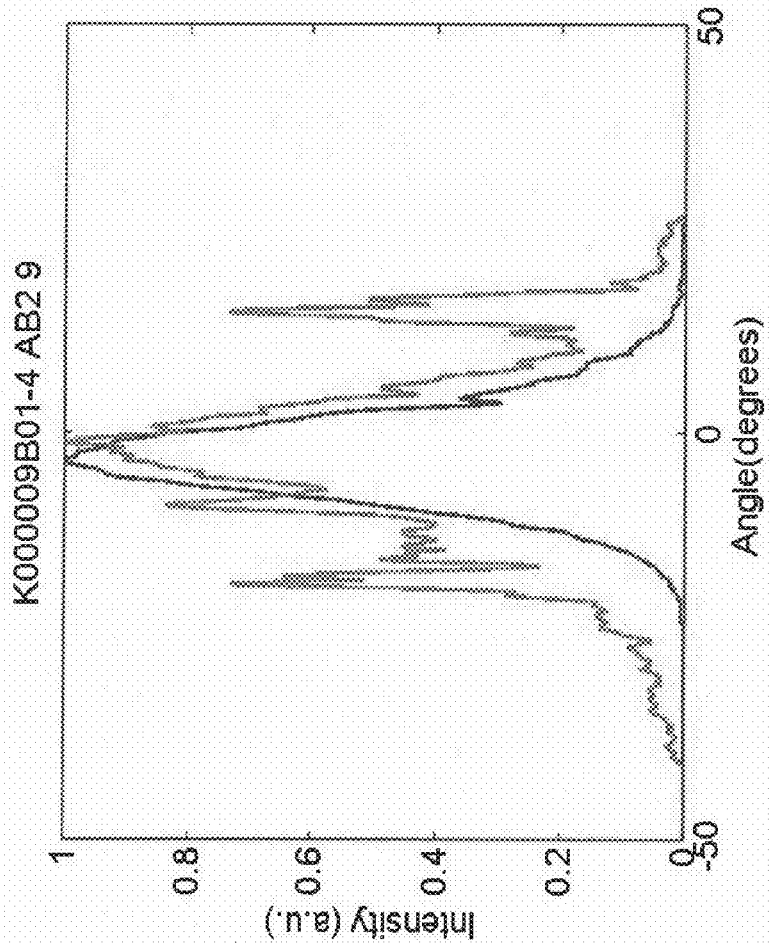

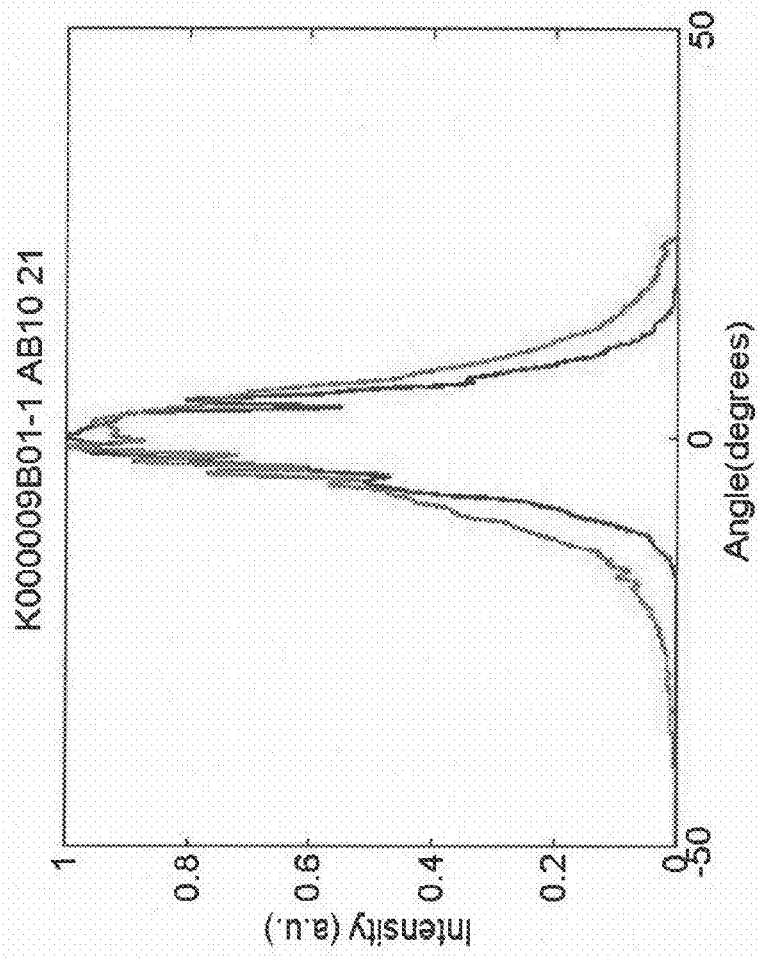

LASER DIODES WITH SCRIBE STRUCTURES

CROSS-REFERENCE TO RELATED APPLICATIONS

The present application claims priority to U.S. Application Ser. No. 61/533,030, filed Sep. 9, 2011; which is related to U.S. Provisional Application No. 61/243,502, filed Sep. 17, 2009; U.S. Provisional Application No. 61/249,568, filed Oct. 7, 2009; and to U.S. Provisional Application No. 61/367, 036, filed Jul. 23, 2010; each of which is incorporated by reference herein for all purposes.

BACKGROUND OF THE INVENTION

This invention is directed to optical devices and related methods. In particular, the invention provides a method and device for emitting electromagnetic radiation using semipolar or non-polar gallium containing substrates. More particularly, the invention provides a method and device using a gallium and nitrogen containing substrate where the backside of the substrate includes multiple trench structures that reduce stray light leaking. The invention can be applied to numerous fields, for example, optical devices, lasers, light emitting diodes, solar cells, photoelectrochemical water splitting and hydrogen generation, photodetectors, integrated circuits, and transistors.

In 1960, the laser was first demonstrated by Theodore H. Maiman at Hughes Research Laboratories in Malibu. This laser utilized a solid-state flash lamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature, which limits their application. One factor that often affects laser performance is straying light. For example, straying light is not usable for intended purposes and often interferes with the laser beam output.

From the above, it is seen that techniques for improving optical devices are highly desired.

BRIEF SUMMARY OF THE INVENTION

This invention is directed to optical devices and related methods. In particular, the invention provides a method and device for emitting electromagnetic radiation using semipolar or non-polar gallium containing substrates. More particularly, the invention provides a method and device using a gallium and nitrogen containing substrate where the backside of the substrate includes multiple trench structures that reduce stray light leaking. The invention is readily applicable to optical devices such as lasers, light emitting diodes, solar cells, and photodetectors.

In one embodiment, the invention provides an optical device having a substrate with a front side and a back side. An active region overlays the front side of the substrate which itself includes at least one quantum well. The device includes a cavity over the active region. The cavity is characterized by a length and a width. A plurality of trenches are provided on the back side of the substrate, preferably non-parallel to the length of the cavity.

According to another embodiment, the invention provides an optical device with a gallium and nitrogen containing substrate having a front side and a back side, the back side including a plurality of trench structures. The plurality of trench structures are aligned in a first direction. The device also includes a laser stripe region formed overlying a portion of the substrate. The laser stripe region has a cavity orientation non-parallel to the first direction. The laser device includes a first cleaved facet provided on a first end, and a second cleaved facet provided on the second end.

According to yet another embodiment, the present invention provides a method for manufacturing an optical device. The method includes providing a gallium and nitrogen containing substrate, the substrate including a front side and a back side. The method also includes forming a laser stripe region overlaying a portion of the front side of the substrate. The laser stripe region is characterized by a cavity orientation being characterized by a first direction, the laser strip region having a first end and a second end. The method also includes providing a first cleaved facet on the first end of the laser stripe region. The method also includes providing a second cleaved facet on the second end of the laser stripe region. Additionally, the method includes forming a plurality of trenches on the back side of the substrate, the plurality of trenches being non-parallel to the first direction.

The present invention enables a cost-effective optical device for laser applications. In a specific embodiment, the present optical device can be manufactured in a relatively simple and cost effective manner. Depending upon the embodiment, the present apparatus and method can be manufactured using conventional materials and/or methods. The laser device uses a nonpolar or semipolar gallium nitride material capable of achieving a violet or blue or green emission, among others. In some embodiments, the laser device is capable of emitting long wavelengths such as those ranging from about 430 nm to 470 nm for the blue wavelength region or 500 nm to about 540 nm for the green wavelength region, but can be others such as the violet region. In a specific embodiment, the present method and structure uses a top-side skip and scribe technique for improved cleaves in the laser device structure. In one or more embodiments, the present invention provides a method using a top side skip-scribe technique for good facets oriented substantially orthogonal to the laser cavities, where the laser cavity is oriented in the c-direction or in the projection of the c-direction. It is to be understood that the trench structures according to the present invention can be used in other types of laser devices, such as laser device having polar orientation, such as a laser fabricated on c-plane GaN. The trench structures are relatively easy and inexpensive to form. In a specific embodiment, the present method and structure improves device performance by reducing leakage light, interference patterns, and other undesirable characteristics of laser devices.

BRIEF DESCRIPTION OF THE DRAWINGS

FIG. 2A is an example of a beam profile affected by stray light.

FIG. 3A are diagrams illustrating top, bottom, and side views of an edge emitting laser device;

FIGS. 4A and 4B provides diagrams illustrating top, bottom, and side views of the edge emitting laser device 300;

FIGS. 6 and 7 are diagrams of near field images of green laser devices with and without laser scribes;

FIGS. 8 and 9 are diagrams of far field images of green laser devices with and without laser scribes;

FIGS. 10 and 11 are diagrams of far field traces of green laser devices with and without laser scribes;

FIGS. 12 and 13 are diagrams of near field images of blue laser devices with and without laser scribes;

FIGS. 14 and 15 are diagrams of far field images of blue laser devices with and without laser scribes; and FIGS. 16 and 17 are diagrams of far field traces of blue laser devices with and without laser scribes.

DETAILED DESCRIPTION OF THE INVENTION

Figure 1:
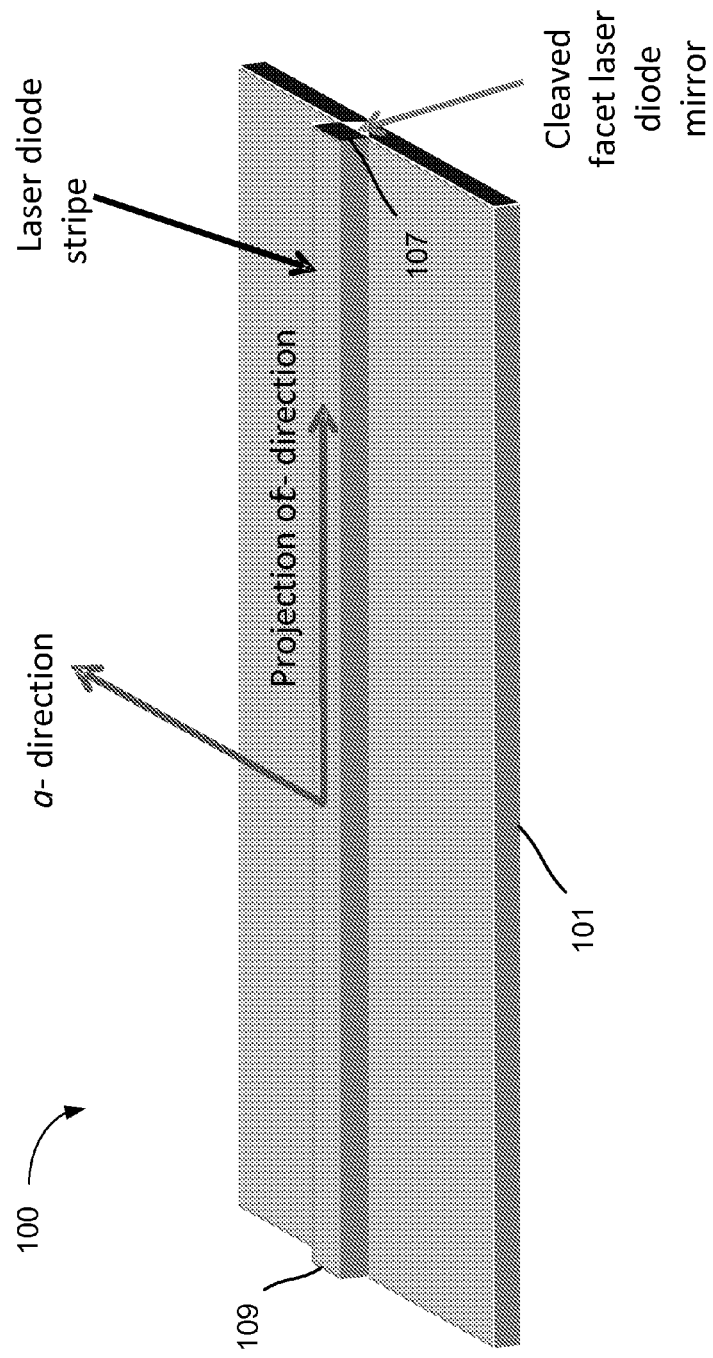
FIG. 1 is a simplified perspective view of a laser device 100 fabricated from a bulk substrate.

FIG. 1 is a perspective view of a laser device 100 fabricated on a bulk substrate according to an embodiment of the present invention. In an exemplary embodiment, the optical device includes a gallium nitride substrate 101 having a non-polar crystalline surface region characterized by an orientation of about −2 degrees to about 2 degrees towards (000-1) and less than about 0.5 degrees towards (11-20). In a specific embodiment, the gallium nitride substrate is a bulk GaN substrate having a nonpolar crystalline surface region. In certain embodiment, the substrate is characterized by a semi-polar orientation. In a specific embodiment, the bulk GaN substrate has a surface dislocation density below $10^5$ cm$^{-2}$ or 10E5 to 10E7 cm-2. The nitride crystal or wafer may comprise $Al_x In_y Ga_{1-x-y} N$, where $0 \le x$, y, $x+y \le 1$. In one specific embodiment, the nitride crystal comprises GaN. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface It is to be appreciated that the trench structures and methods thereof described according to the embodiments of the present invention can be used for laser diode having non-polar or semi-polar orientations.

In a specific embodiment on the {20-21} GaN surface orientation, the device has a laser stripe region formed overlying a portion of the off-cut crystalline orientation surface region. In a specific embodiment, the laser stripe region is characterized by a cavity orientation substantially in a projection of a c-direction, which is substantially normal to an a-direction. In a specific embodiment, the laser strip region has a first end 107 and a second end 109. In a preferred embodiment, the device is formed on a projection of a c-direction on a {20-21} gallium and nitrogen containing substrate having a pair of cleaved mirror structures, which face each other.

In a preferred embodiment, the device has a first cleaved facet provided on the first end of the laser stripe region and a second cleaved facet provided on the second end of the laser stripe region. In one or more embodiments, the first cleaved facet is substantially parallel with the second cleaved facet. Mirror surfaces are formed on each of the cleaved surfaces. The first cleaved facet comprises a first mirror surface. In a preferred embodiment, the first mirror surface is provided by a top-side skip-scribe scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titania, tantalum pentoxide, zirconia, including combinations, and the like. Depending upon the embodiment, the first mirror surface can also comprise an anti-reflective coating.

Also in a preferred embodiment, the second cleaved facet comprises a second mirror surface. The second mirror surface is provided by a top side skip-scribe scribing and breaking process according to a specific embodiment. Preferably, the scribing is diamond scribed or laser scribed or the like. In a specific embodiment, the second mirror surface comprises a reflective coating, such as silicon dioxide, hafnia, and titania, tantalum pentoxide, zirconia, combinations, and the like. In a specific embodiment, the second mirror surface comprises an anti-reflective coating.

The length of the laser stripe ranges from about 50 microns to about 3000 microns, and the width from about 0.5 microns to about 50 microns. In a preferred embodiment, the width is about 1 to 20 microns (or 1 to 2 microns) for a single mode laser device. Usually the width is substantially constant, and it and the length are often formed using known masking and etching processes.

In a specific embodiment on a nonpolar Gallium containing substrate, the device is characterized by a spontaneously emitted light that is polarized substantially perpendicular to the c-direction. The spontaneously emitted light is characterized by a polarization ratio of greater than 0.1 to about 1 perpendicular to the c-direction. In a preferred embodiment, the spontaneously emitted light is characterized by a wavelength ranging from about 430 nanometers to about 470 nm to yield a blue emission, or about 500 nanometers to about 540 nanometers to yield a green emission, and others. For example, the spontaneously emitted light can be violet (e.g., 395 to 420 nanometers), blue (e.g., 430 to 470 nm); green (e.g., 500 to 540 nm), or others. In a preferred embodiment, the spontaneously emitted light is highly polarized and has a polarization ratio of greater than 0.4. In another specific embodiment on a semipolar {20-21} Ga-containing substrate, the device emits spontaneously polarized light substantially parallel to the a-direction or perpendicular to the cavity direction, which is oriented in the projection of the c-direction.

The invention provides an alternative device structure capable of emitting 501 nm and greater light in a ridge laser embodiment. The device typically includes at least one of:

an n-GaN cladding layer with a thickness from 100 nm to 3000 nm with Si doping level of 5E17 to 3E18 cm-3 an n-side SCH layer comprised of InGaN with molar fraction of indium of between 2% and 10% and thickness from 20 to 200 nm multiple quantum well active region layers comprised of at least two 2.0-8.5 nm InGaN quantum wells separated by 1.5 nm and greater, and optionally up to about 12 nm, GaN or InGaN barriers a p-side SCH layer comprised of InGaN with molar a fraction of indium of between 1% and 10% and a thickness from 15 nm to 100 nm an electron blocking layer comprised of AlGaN with molar fraction of aluminum of between 6% and 22% and thickness from 5 nm to 20 nm and doped with Mg.

a p-GaN cladding layer with a thickness from 400 nm to 1000 nm with Mg doping level of 2E17 cm-3 to 2E19 cm-3 and a p++-GaN contact layer with a thickness from 20 nm to 40 nm with Mg doping level of 1E19 cm-3 to 1E21 cm-3

In a specific embodiment, the laser device is fabricated on a {20-21} substrate.

Figure 2:
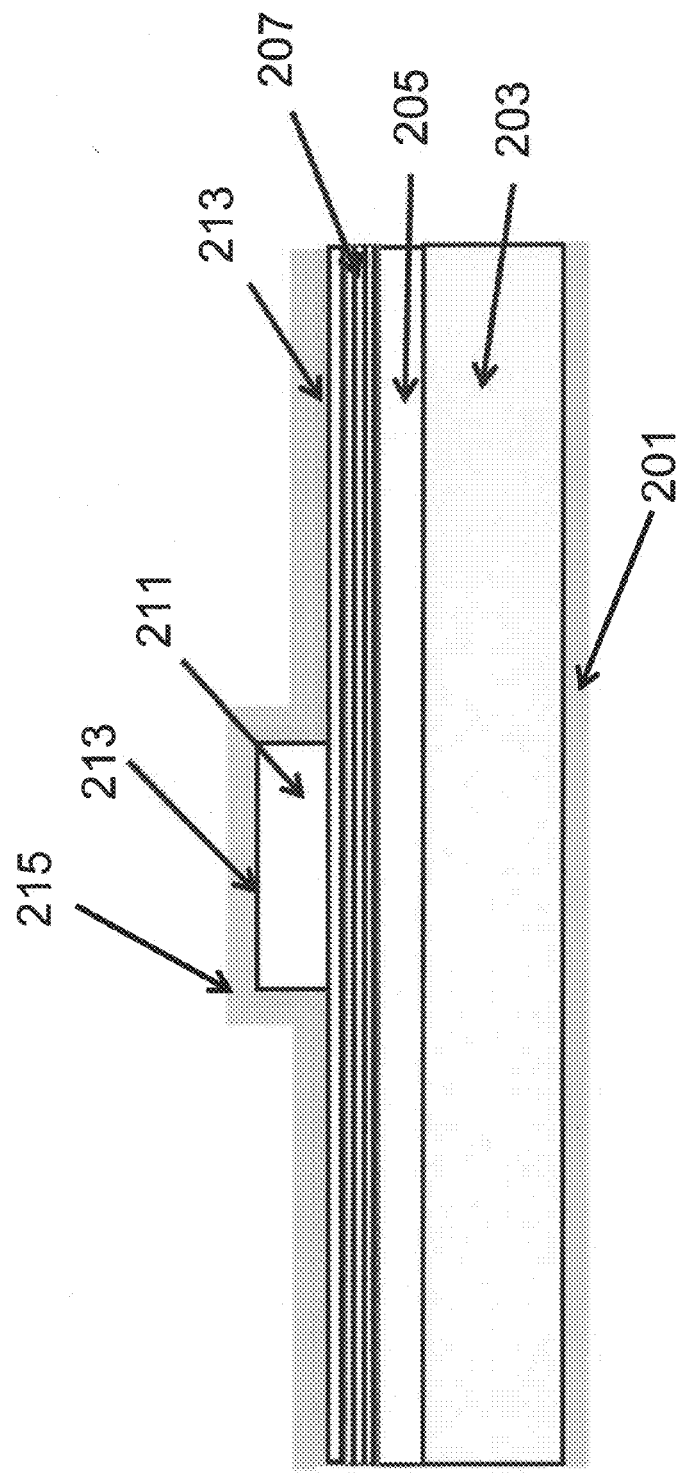
FIG. 2 is a detailed cross-sectional view of a laser device 200 fabricated on a {20-21} substrate.

FIG. 2 is a cross-sectional view of a laser device 200 fabricated on a {20-21} substrate according to an embodiment of the present invention. As shown, the laser device includes gallium nitride substrate 203, which has an underlying n-type metal back contact region 201. In a specific embodiment, the metal back contact region is made of a suitable material such as those noted below and others.

In a specific embodiment, the device also has an overlying n-type gallium nitride layer 205, an active region 207, and an overlying p-type gallium nitride layer structured as a laser stripe region 211. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

In a specific embodiment, an n-type $Al_uIn_vGa_{1-u-v}N$ layer, where 0≤u, v, u+v≤1, is deposited on the substrate. In a specific embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 900 to 1200 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm, is initiated.

In a specific embodiment, the laser stripe region is made of the p-type gallium nitride layer 211. In a specific embodiment, the laser stripe is provided by an etching process selected from dry etching or wet etching. In a preferred embodiment, the etching process is dry. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region, which exposes 213 contact region. In a specific embodiment, the dielectric region is an oxide such as silicon dioxide or silicon nitride. The contact region is coupled to an overlying metal layer 215. The overlying metal layer is a multilayered structure containing gold and platinum (Pt/Au), nickel gold (Ni/Au).

In a specific embodiment, the laser device has active region 207. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may be comprised of multiple quantum wells, with 2-10 quantum wells. The quantum wells may be comprised of InGaN with GaN or InGaN barrier layers separating them. In other embodiments, the well layers and barrier layers comprise $Al_wIn_xGa_{1-w-x}N$ and $Al_yIn_zGa_{1-y-z}N$, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers may each have a thickness between about 1 nm and about 20 nm. The composition and structure of the active layer are chosen to provide light emission at a preselected wavelength. The active layer may be left undoped (or unintentionally doped) or may be doped n-type or p-type.

In a specific embodiment, the active region can also include an electron blocking region, and a separate confinement heterostructure. In some embodiments, an electron blocking layer is preferably deposited. The electron-blocking layer may comprise $Al_sIn_tGa_{1-s-t}N$, where 0≤s, t, s+t≤1, with a higher bandgap than the active layer, and may be doped p-type. In one specific embodiment, the electron blocking layer comprises AlGaN. In another embodiment, the electron blocking layer comprises an AlGaN/GaN super-lattice structure, comprising alternating layers of AlGaN and GaN, each with a thickness between about 0.2 nm and about 5 nm.

As noted, the p-type gallium nitride structure is deposited above the electron blocking layer and active layer(s). The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry. The device also has an overlying dielectric region, which exposes 213 contact region. In a specific embodiment, the dielectric region is an oxide such as silicon dioxide.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device.

The laser devices illustrated in FIGS. 1 and 2 and described above, along with laser devices of conventional designs, often suffer from stray light. More specifically, stray light leaks from the waveguide down into the substrate. Once in the substrate, the stray light can interfere and thereby degrade the output beam profile of the laser diode. For example, the stray light reflects off various surfaces such as the substrate edges and then interferes with the primary guided mode, which results in fringing patterns and/or adding stray radiation in and around the primary laser spot. The photograph of the blue laser beam projected onto a wall in FIG. 2A is an example of a beam profile affected by such stray light.

In various embodiments, filtering mechanisms are provided on the laser device to reduce stray light. In a preferred embodiment, the present invention provides trench structures on the back side of the substrate. Among other things, the trench structures can filter or eliminate much of the stray light within the substrate. In various embodiment, the trench structure are formed by laser scribing processes and relatively deep. The trench structures reflect and/or scatter the substrate light out of the path of the primary guided laser beam. In certain applications, the trench structures scatter stray light of the substrate all together. By reducing the amount of stray light, less stray light is allowed to interfere with the primary guided mode. The amount of stray light in the vicinity of the laser beam is also reduced.

Figure 3:
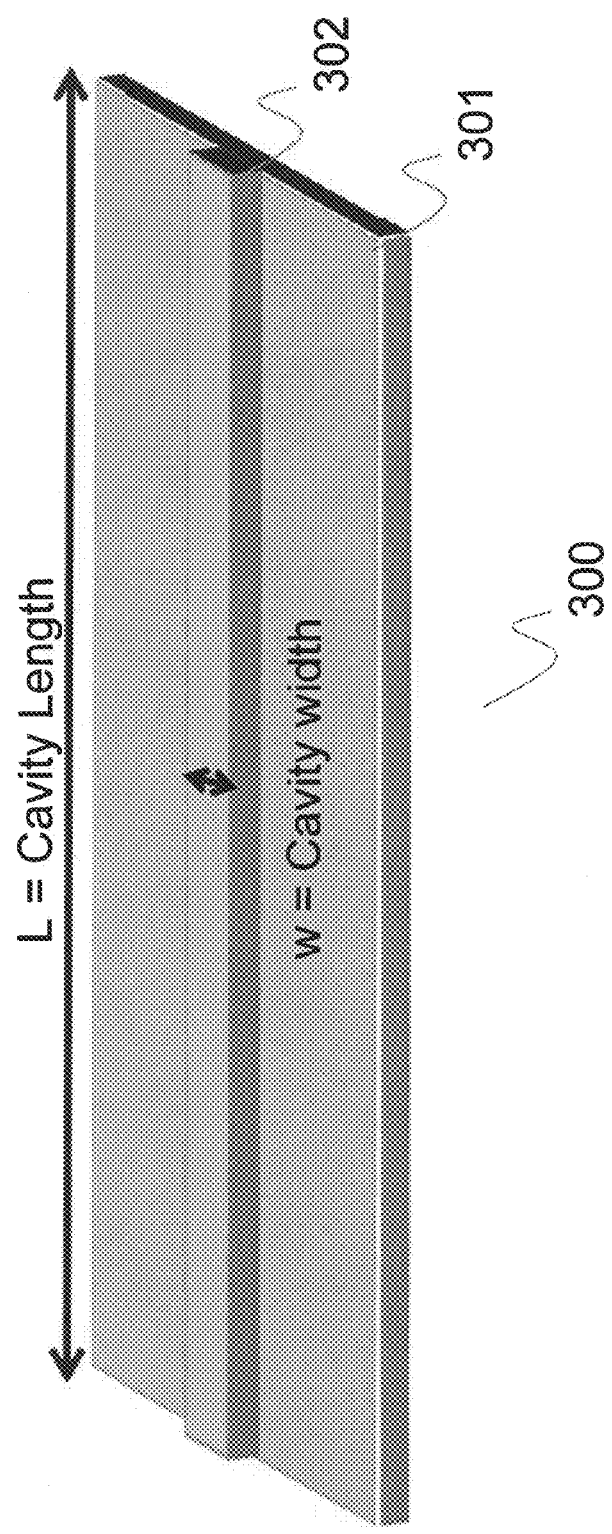
FIG. 3 is a diagram illustrating an edge emitting laser device 300.

FIG. 3 is a simplified diagram illustrating an edge emitting laser device 300 according to an embodiment of the present invention. As shown in FIG. 3, the edge emitting laser diodes includes a cavity 302 positioned the top side of a substrate 301. As described above, the cavity 302 functions as a waveguide. In a specific embodiment, the cavity 302 includes a front side and the rare side. The rare side comprises a highly reflective coating to channel laser beam output to the front side. The cavity is characterized by a cavity length L and a cavity width w.

FIG. 3A provides simplified diagrams illustrating top, bottom, and side views of an edge emitting laser device. As shown in FIG. 3A, the bottom side of the substrate, as evident from the bottom and side views, does not include any trench structures.

FIG. 4A provides simplified diagrams illustrating top, bottom, and side views of the edge emitting laser device 300 according to an embodiment of the present invention. As shown in FIG. 4, as evident from the bottom and side views, an edge emitting laser device includes a plurality of trench structures on the backside of the laser device substrate. As shown, the trench structures are substantially perpendicular to the length of the cavity 302. It is to be appreciated that the trench structures can be in other non-parallel orientations against the length of the cavity It is to be appreciated that the trench structures can be formed in various ways. According to an embodiment, after performing the top-side laser fabrication processes (e.g., forming the cavity 302), the substrate 301 is thinned to about 60 to 75 microns. Either before or after back side metal is deposited on the backside of the substrate 301 to form the n-contact, the backside of the substrate is subjected to a laser scribing process to form trench features that are positioned substantially non-parallel (e.g., perpendicular) to the longitudinal direction of the optical cavity. The method for forming the trenches can be others, such as diamond scribing, dry etching, wet etching, wheel scribing, and others.

In a preferred embodiment, trenches are positioned 30 degrees off of perpendicular to scatter and reflect the light away from the cavity 302. The trench widths range from 0.1 to 10 microns, depending on the laser scriber settings and the depth of the trench. For example, the trench depths can be varied by changing the laser power or travel speed during the laser scribing process. It is to be appreciated that the trenches can be formed in other ways as well, such as etching, scribing, etc.

In various embodiments, the trench depth is specifically selected to avoid penetrating the optical pathway of the primary guided mode, which usually terminates 5 to 20 microns below the surface of the topside of the substrate, but can be 40 to 20 microns from the topside of the surface. On the other hand, the trenches should be deep enough such that they substantially interfere with the light leaking away from the optical device. As can be seen from the side view of the laser emitting device, trench 320 extends from the bottom side of the substrate 301 to a region that is very close to the substrate's top side, which is close to the cavity 302. In a preferred embodiment, the bottom of the trench is about 10 to 15 microns below the top surface of the substrate 301. For example, if the substrate is 70 microns thick, the trench depth is about 55 to 60 microns. In another example, if the substrate thickness is 60 microns, the trench depth is about 45-50 microns. Depending on the application, the spacing of trenches (e.g., the distance between trenches 321 and 320) can range from 10 microns to 100 or 200 microns.

Figure 4B:
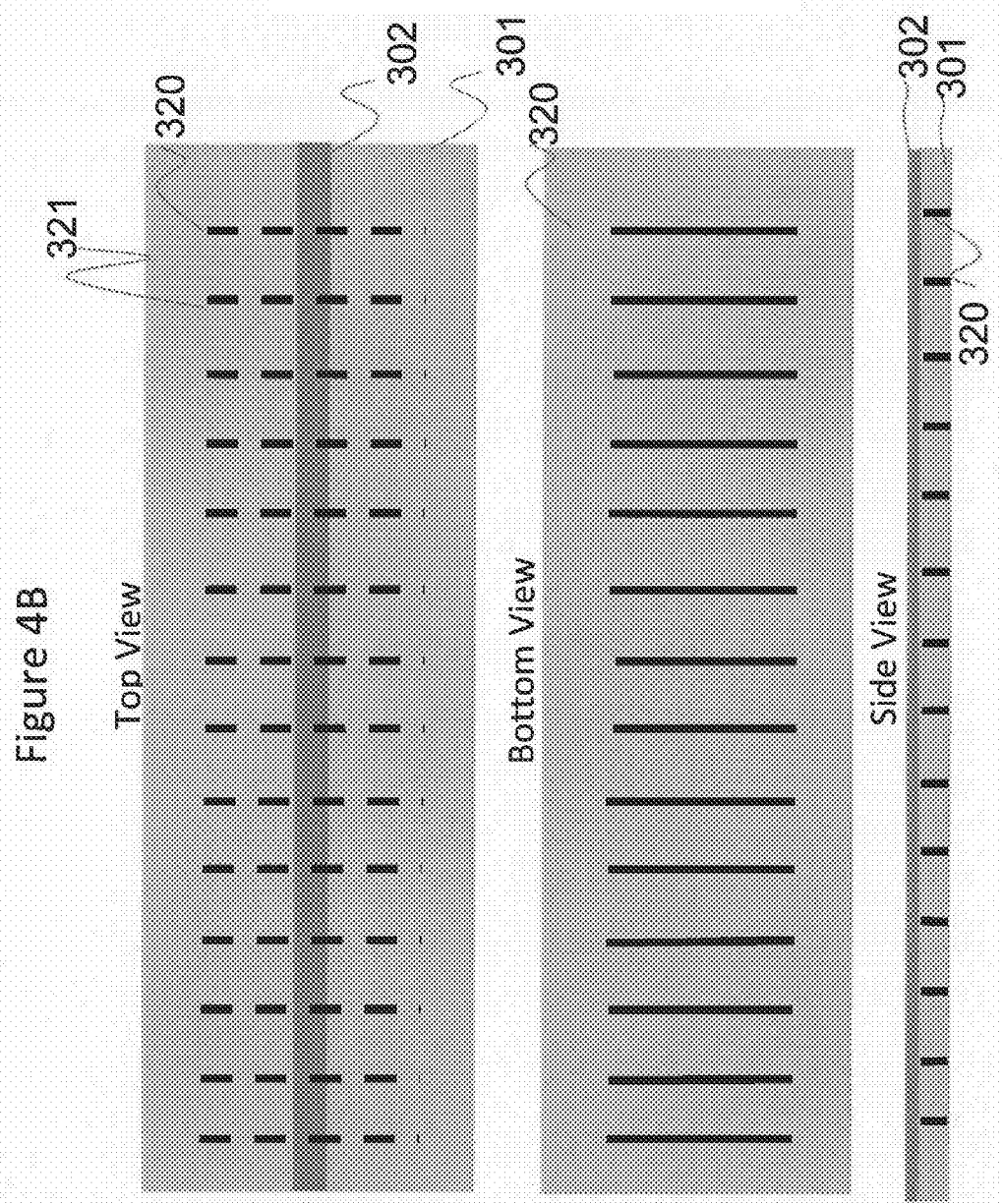

As illustrated in FIG. 4A, trench structures extend from one end of substrate material to the opposite end of the substrate material. Depending on the application, the length of the trench structures may vary. FIG. 4B is a simplified diagram illustrating trench structures provided on the bottom side of the substrate according to an embodiment of the present invention. This diagram is merely an example, which should not unduly limit the scope of the claims. One of ordinary skill in the art would recognize many variations, alternatives, and modifications. As an example, trench structures 321 and 320 do not extend to the edges of the substrate 301. For example, the trench structures may have a length of about 5 um to the length of the substrate. In a preferred embodiment, trench structures are characterized by a length of about 30 um to 100 um, where the width of the substrate is about 150 to 500 um.

Figure 5A:
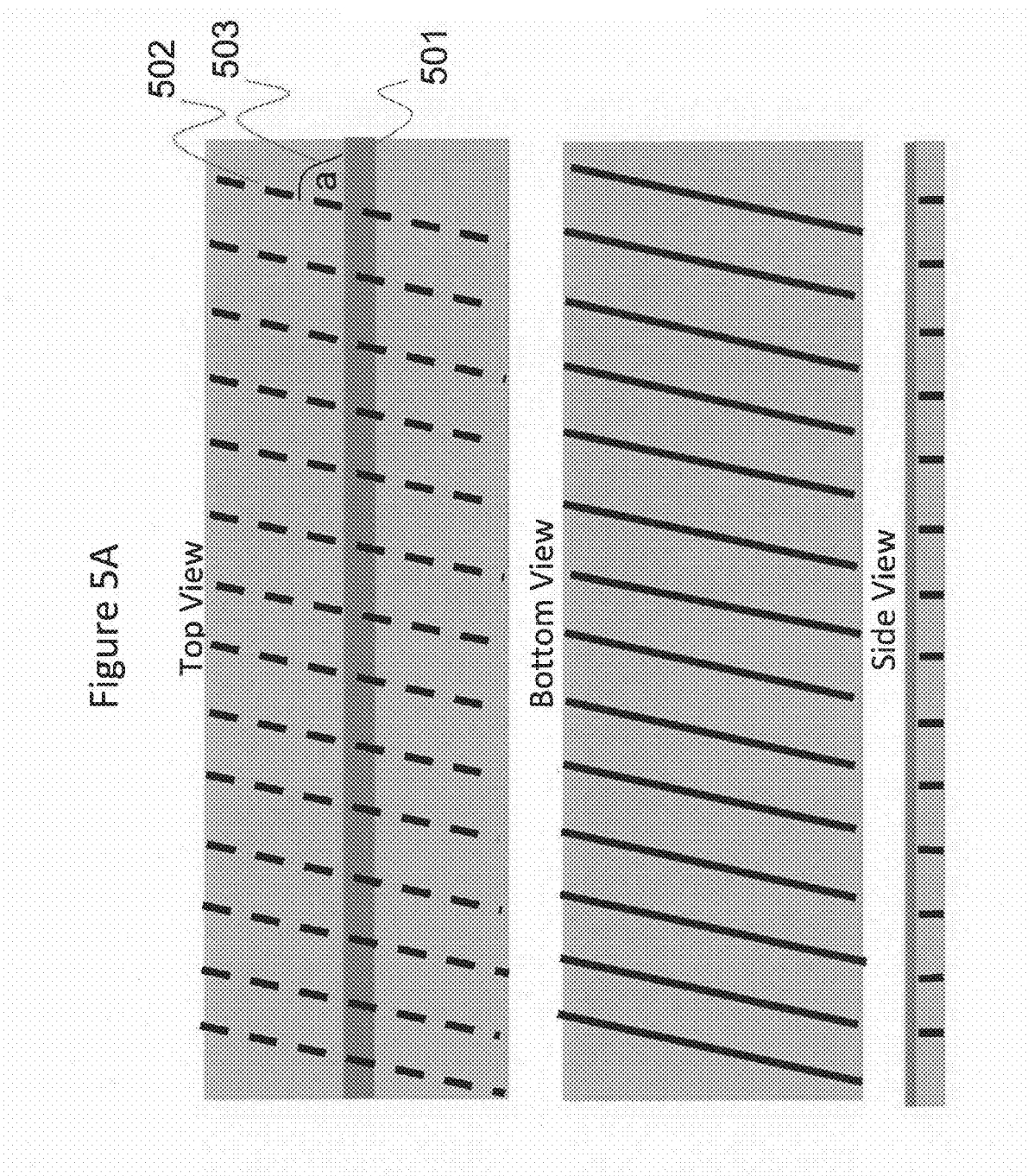
FIGS. 5A and 5B are diagrams of laser devices with trench structures.

As mentioned above, trench structures may be arranged in various orientations. As shown in FIGS. 4A-4B, trench structures are substantially straight and perpendicular to the length of the cavity. Depending on the application, trench structures may have other orientations as well. FIG. 5A is a simplified diagram a laser device with trench structures according to an embodiment of the present invention. This diagram is merely an example, which should not unduly limit the scope of the claims. One of ordinary skill in the art would recognize many variations, alternatives, and modifications. As shown in FIG. 5A, trench structures are substantially straight and oriented at an angle to the length of the cavity. In an embodiment, the trench structures 502 are oriented at an angle 503 of about 60 degrees off the length direction of the cavity 501. Depending on the application, the angle 503 can be 10 to 80 degrees.

Figure 5B:
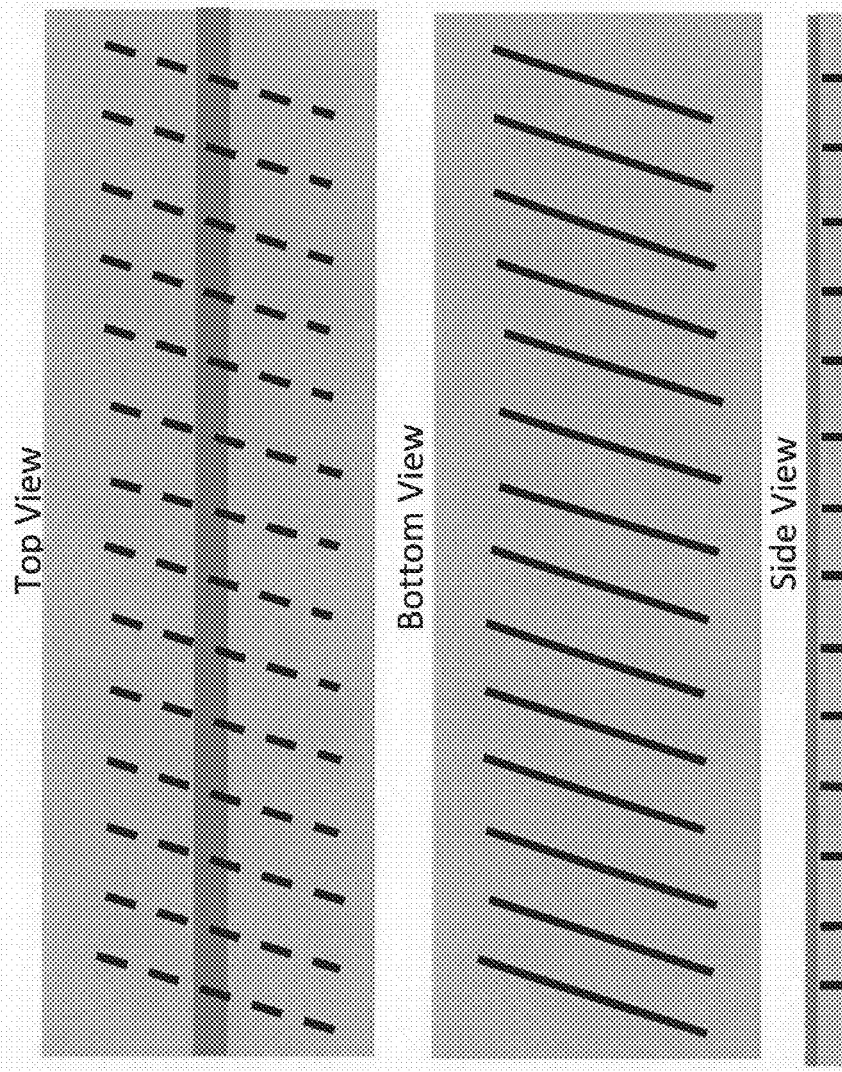

As illustrated in FIG. 5A, trench structures extend from one end of substrate material to the opposite end of the substrate material. Depending on the application, the length of the trench structures may vary. FIG. 5B is a simplified diagram illustrating trench structures provided on the bottom side of the substrate according to an embodiment of the present invention. As an example, trench structures and do not extend to the edges of the substrate. For example, the trench structures may have a length of about 5 um to the length of the substrate.

It is to be appreciated that the process of forming trench structures can be convenient integrated into manufacturing process of laser devices. One method of processing a laser device is as follows:
1. Start;
2. Provide processed substrate including laser devices with ridges;
3. Thin substrate from backside;
4. Form trench structures on the backside of the substrate;
5. Form backside n-contact;
6. Scribe pattern for separation of the laser devices configured in bar structures;
7. Break scribed pattern to form a plurality of bar structures;
8. Stack bar structures;
9. Coat bars structures;
10. Singulate bar structures into individual dies having laser device; and
11. Perform other steps as desired.

Another method of processing a laser device is:
1. Start;
2. Provide processed substrate including laser devices with ridges;
3. Thin substrate from backside;
4. Form backside n-contact;
5. Form trench structures on the backside of the substrate;
6. Scribe pattern for separation of the laser devices configured in bar structures;
7. Break scribed pattern to form a plurality of bar structures;
8. Stack bar structures;
9. Coat bars structures;
10. Singulate bar structures into individual dies having laser device; and
11. Perform other steps as desired.

The above sequence of steps is used to form individual laser devices on a die from a substrate structure according to one or more embodiments of the present invention. In one or more preferred embodiments, the method includes cleaved facets substantially parallel to each other and facing each other in a ridge laser device configured on a non-polar gallium nitride substrate material. Depending upon the embodiment, one or more of these steps can be removed, modified, replaced, re-arranged, combined, or removed, or other steps may be added without departing from the scope of the claims herein.

In a specific embodiment, the method begins with a gallium nitride substrate material including laser devices and preferably ridge laser devices. The substrate has been subjected to front side processing according to a specific embodiment. After front side processing has been completed, one or more of the GaN substrates are mounted onto a sapphire carrier wafer or other suitable carrier. As an example, the method uses Crystalbond 909, which is a conventional mounting thermoplastic. The thermoplastic can be dissolved in acetone or other suitable solvent.

In a specific embodiment, the carrier wafer is mounted to a lapping jig. An example of such lapping jig is made by Logitech Ltd. of the United Kingdom, or other vendor. The lapping jig helps maintain planarity of the substrates during the lapping process according to a specific embodiment. As an example, the starting thickness of the substrates are ~325 um+/−20 um, but can be, e.g. 400 um. In a specific embodiment, the method laps or thins the substrates down to 60-80 um thickness, but can also be thinner or slightly thicker. In a preferred embodiment, the lapping jig is configured with a lapping plate, which is often made of a suitable material such as cast iron configured with a flatness of less than 5 um. Preferably, the method uses a lapping slurry that is 1 part silicon carbide (SiC) and 10 parts water, but can also be other variations. In a specific embodiment, the SiC grit is about 5 um to about 10 um in dimension. In one or more embodiments, the lapping plate speed is suitable at about 10 revolutions per minute. Additionally, the method can adjust the lapping jig's down pressure to achieve a desired lapping rate, such as 2-3 um/min or greater or slightly less according to one or more embodiments.

In a specific embodiment, the present method includes a lapping process that may produce subsurface damage in the GaN material to cause generation of mid level traps or the like. The midlevel traps may lead to contacts having a Schottky characteristic. Accordingly, the present method includes one or more polishing processes such that ~10 um of material having the damage is removed according to a specific embodiment. As an example, the method uses a Politex™ polishing pad of Rohm and Haas, but can be others, that is glued onto a stainless steel plate. A polishing solution is Ultrasol 300K manufactured by Eminess Technologies. The Ultra-Sol 300K is a high-purity colloidal silica slurry with a specially designed alkaline dispersion. It contains 70 nm colloidal silica and has a pH of 10.6. The solids content is 30% (by weight). In a specific embodiment, the lapping plate speed is 70 rpm and the full weight of the lapping jig is applied. In a preferred embodiment, the method includes a polishing rate of about ~2 um/hour.

In other embodiments, the present invention provides a method for achieving high quality n-type contacts for m-plane GaN substrate material. In a specific embodiment, the method provides contacts that are rough to achieve suitable ohmic contact. In a specific embodiment, the roughness causes exposure of other crystal planes, which lead to good contacts. In a preferred embodiment, the present method includes a lapped surface, which is rough in texture to expose more than one or multiple different crystal planes. In other embodiments, lapping may be followed by etching such as dry etching and/or wet etching. In a specific embodiment, etching removes the subsurface damage, however, it is likely not to planarize the surface like polishing. For example, the method for forming contacts is described in U.S. Provisional Patent Application No. 61/249,568, filed Oct. 7, 2009, which is incorporate by reference herein for all purposes.

After the thinning process is complete, the method forms n-contacts on the backside of the substrates according to one or more embodiments. At this point, the thinned substrates are still mounted to and maintained on the sapphire wafer. In a preferred embodiment, the thinned substrates are "batch process" for efficiency and handling. The method using batch processing helps prevent any damage associated with handling very thin (60-80 um) substrates.

The trench structures as illustrated in FIGS. 4A-4B and 5A-5B can be formed before or after the n-contact is formed. In a specific embodiment, a laser scribing process is performed before forming the n-contact to provide the trench structures. In a preferred embodiment, the trench structures are formed before forming n-contact metal. Depending on the application, the trench structures can be formed in different ways. For example, laser scribing devices are used to form the trench structures. The laser scribing devices may operate in a wavelength of about 270 nm to 370 nm. In a preferred embodiment, the method uses a UV (355 nm) laser to form the trench structures. In a specific embodiment, the laser is configured on a system, which allows for accurate scribe lines configured in one or more different patterns and profiles. For example, the laser is configured to scribe a desired depth and pattern of trench structures without completely cutting through the substrate. It is to be appreciated that trench structures can also be formed by using cutting tools (cutting wheel), dry etching, wet etching, diamond scribing, etc.

The trenches can be formed before or after n-contact formation. It may be desirable to form them prior to n-contact deposition to avoid introducing discontinuities in the n-contact during the trench formation process. Additionally, formation of the trenches through the re-contact metal may be difficult since one would have to contend with the metal layers. Alternatively, in some cases it may be favorable to form the trenches after the n-contact is formed. This may be favorable due to ease of process or a more efficient process flow.

As an example, the backside contact includes 300 Å Al/1000 Å Ni/3000 Å Au or about 300 Å Al/3000 Å Au or other suitable materials such as Ti/Pt/Au. In a specific embodiment, the contact is a stack of metals that are deposited by e-beam evaporation or sputtering or other suitable techniques. In a preferred embodiment and prior to the metal stack deposition, the method includes use of a wet etch such as an hydrofluoric acid wet etch to remove any oxides on the surface. In a specific embodiment, the metal stack is preferably not annealed or subjected to high temperature processing after its formation.

After the n-contact is formed, the substrates are demounted from the sapphire carrier wafer and cleaned in acetone and isopropyl alcohol according to a specific embodiment. The substrates are then mounted onto vinyl tape for the scribe and break process depending upon the embodiment. In a preferred embodiment, the tape does not leave any residue on the laser bars, which are substantially free from such residues, which are often polymeric in nature or particulates.

As mentioned above, trench structures illustrated in FIGS. 4 and 5 can be formed before and/or after forming the n-contact. As an example, trench structures are formed on the backside of the substrate after forming the n-contact.

Next, the method includes one or more scribing processes. In a specific embodiment, the method includes subjecting the substrates to a laser for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in one or more different patterns and profiles. In one or more embodiments, the scribing can be performed on the backside, front-side, or both depending upon the application.

In a specific embodiment, the method uses backside scribing or the like. With backside scribing, the method preferably forms a continuous line scribe that is perpendicular to the laser bars on the backside of the GaN substrate. In a specific embodiment, the scribe is generally 15-20 um deep or other suitable depth. Preferably, backside scribing can be advantageous. That is, the scribing process does not depend on the pitch of the laser bars or other like pattern. Accordingly, backside scribing can lead to a higher density of laser bars on each substrate according to a preferred embodiment. In a specific embodiment, backside scribing, however, may lead to residue from the tape on one or more of the facets. In a specific embodiment, backside scribing often requires that the substrates face down on the tape. With front-side scribing, the backside of the substrate is in contact with the tape.

In a preferred embodiment, the present method uses front-side scribing, which facilitates formation of clean facets. In a specific embodiment, the front-side scribing process is preferably used. In a specific embodiment, the method includes a scribe pattern to produce straight cleaves with minimal facet roughness or other imperfections. Further details of scribing are provided below.

Scribe Pattern: The pitch of the laser mask is about 200 um. The method uses a 170 um scribe with a 30 um dash for the 200 um pitch. In a preferred embodiment, the scribe length is maximized or increased while maintaining the heat affected zone of the laser away from the laser ridge, which is sensitive to heat.

Scribe Profile: A saw tooth profile generally produces minimal facet roughness. It is believed that the saw tooth profile shape creates a very high stress concentration in the material, which causes the cleave to propagate much easier and/or more efficiently. However, there can be a large variety of scribe profiles and sequences to yield high quality cleaved facets.

In a specific embodiment, the present method provides for a scribe suitable for fabrication of the present laser devices. The method includes a breaking process to form a plurality of bar structures. After the GaN substrates are scribed, the method uses a breaker to cleave the substrates into bars. In a specific embodiment, the breaker has a metal support that has a gap spacing of about 900 um. The substrate is positioned over the support so that the scribe line is in the center. A suitably sharp ceramic blade, then applies pressure directly on the scribe line causing the substrate to cleave along the scribe line.

After cleaving, the bars are stacked in a fixture that allows for coating the front facet and back facet, which are in parallel alignment with each other and facing each other. The front facet coating films can be selected from any suitable low reflectance design (AR design) or highly reflective coating (HR design). The AR design may include a quarter wave coating of $Al_2O_3$ capped with a thin layer of $HfO_2$ according to a specific embodiment. The $Al_2O_3$ coating is a robust dielectric, and $HfO_2$ is dense, which helps environmentally passivate and tune the reflectance of the front facet. In a specific embodiment, the front facet is coated with a HR design. The HR design includes several quarter wave pairs of $SiO_2/HfO_2$. In a specific embodiment, roughly 2-5 pairs may be used to achieve a reflectance over 80%. These coating films are preferably deposited by e-beam evaporation. In a specific embodiment, the back facet is coated with a high reflectance HR design. The HR design includes several quarter wave pairs of SiO$_2$/HfO$_2$. In a specific embodiment, roughly 6-7 pairs may be used to achieve a reflectance over 99%. In certain embodiments, the front facet is substantially free from any coating, and the back facet comprises highly reflective coating.

In a preferred embodiment, the method uses a suitable deposition system configured for deposition of each of the facets without breaking vacuum. The deposition system includes a dome structure with sufficient height and spatial volume. The system allows for the plurality of bars configured in a fixture to be flipped from one side to another side and to expose the back facet and the front facet according to a specific embodiment. In a preferred embodiment, the method allows for first deposition of the back facet, reconfiguring the bar fixture to expose the front facet, and second deposition of the front facet without breaking vacuum. In a preferred embodiment, the method allows for deposition of one or more films on front and back without breaking vacuum to save time and improve efficiency. Other embodiments can break vacuum.

After the facets of the bars have been coated, the method includes testing the laser devices in bar form prior to die singulation. In a specific embodiment, the method singulates the bars by performing a scribe and break process (similar to the facet cleave). Preferably, the method forms a shallow continuous line scribe on the top side of the laser bar according to a specific embodiment. The width of each die is about 200 um, which may reduce the support gap to 300 um or so. After the bars have been cleaved into individual die, the tape is expanded and each of the die is picked off of the tape. Next, the method performs a packing operation for each of the die according to one or more embodiments.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero).

To further prove the present method and resulting structures, we performed certain experiments. In these experiments, we manufactured blue lasers with and without scribes; and green lasers with and without scribes. The scribes and/or trench regions were configured to reduce interference patterns, leakage light, and other undesirable characteristics in the laser devices. In this example, the laser structures were similar in design to those described in this specification and more particularly in FIG. 2. The laser structures were formed using a GaN bulk substrate, n-type doped wave-guiding layer (e.g., cladding region) overlying the substrate, a plurality of quantum well regions (one to ten), each of the quantum well regions including barrier regions, a GaN wave-guiding layer (e.g., cladding region), p-type cladding layer, and metal contact region. The GaN bulk substrate is configured to have a surface region oriented on m-plane {10-11} for blue lasers and semi-polar {20-21} for green lasers. Each of the substrate surface regions is off-cut about 1 Degrees, although there may be variations. Device layers were formed overlying the off-cut surface regions, which were either non-polar or semipolar GaN.

In a specific embodiment, the method uses a laser scribing operation to ablate a plurality of regions on a backside of the laser devices or more particularly the GaN substrate. Each of the scribes was about 55 microns in depth, although they may vary. Each of the scribes extended within a center region underlying a ridge of the laser devices and configured in a parallel manner normal to the direction of the laser ridge. That is, the scribes were originated from a backside of the GaN substrate underlying a vicinity of the laser ridge. Depending upon the embodiment, multiple scribes can be used in a single or multiple laser devices, which are formed on the GaN substrate. The scribe regions are configured from about 1 to about 70 microns in depth, although there can be variations, but should be less than the thickness of the GaN substrate. In this example, the depth of each scribe can be 5% to 90% of the thickness of the GaN substrate. Each of the scribe regions has a width of 1 to 10 microns. Each of the scribe regions has a length that extends towards respective edges of the substrate although not completely on the edges, although there may be variations. The scribe regions are formed using a UV laser configured with a 355 nm source and an output power of 30 to 300 milli-Watts. The laser is pulsed having a pulse time in a nano-second regime, e.g., 2-100 nano-seconds.

In this example, the laser scribe removes GaN material creating a voided crevasse that is partially filled with gallium containing slag material, which is a residue from the ablation process. This slag is typically (but not always) removed in subsequent acid dips, which leaves behind just a crevasse. It is believed that the surface of the laser scribed GaN is gallium rich. Although it is not desirable to have loose slag on the laser chip, we believe that the presence of slag reduces the waste light seen at the facet (more light scattering) and also slightly improves the electrical contact. We observed images from SEMs of the laser scribed GaN sidewalls, which show some roughness beyond a cleaved surface. The scribe regions lead to better performing laser devices in this example.

That is, the present laser device outputs a laser beam through the ridge laser structure in operation. The laser operates substantially without interference patterns, leakages, and other undesirable characteristics. Unfortunately, a portion of light leaks out of the waveguide in a transverse direction towards the bottom region of the GaN substrate. The leaking light causes interference patterns, waste light, and undesirable electromagnetic radiation, which is preferably reduced for certain applications. The leaking light in this example is scattered using the plurality of scribe regions to reduce the amount of waste light and reduce the interference patterns, which are undesirable. The scribe regions (or other structures) reduce the amount of waste light and other interference patterns.

FIGS. 6 and 7 are diagrams of near field images of green laser devices with and without laser scribes according to embodiments of the present invention. As shown in FIG. 6, the images were taken by focusing the laser structures onto a CCD camera. The CCD camera was manufactured by Ocean Optics, Inc., which captures the laser structure and intensity of light derived from the laser structures. As shown, the intensity plots are on log scale (so the substrate light can be seen in a desirable manner). Also, measured power in the substrate as a fraction of the total output power is shown in white characters. The periodic bright spots are an artifact of saturation of the CCD camera and are not significant. As shown, the fraction of total power lost was about 18.3%, although there were slight variations, for the green laser devices without the laser scribes according to the present invention. Referring now to FIG. 7, which includes the laser scribes, as shown, laser scribes block the light underneath the ridge, which reduce the fraction of light lost from the laser structures. As shown, a large amount of substrate light is right underneath the ridge so much of the substrate light is blocked. The scribe structures were configured as described. The power lost was about 1.2%, which was an unexpected and significant improvement.

FIGS. 8 and 9 are diagrams of far field images of green laser devices with and without laser scribes according to embodiments of the present invention. As shown, each of the images are projected on a screen (i.e., projector screen) within a distance from the laser source. That is, the laser was free from any optics and emission occurred and projected on the screen, which was used to capture the image shown herein. The amount of light in the substrate correlates with the strength of the interference pattern, as shown. The substrate of the laser is oriented to the right, as shown. Referring now to FIG. 9, which includes the scribe structures, the substrate of the laser is oriented to the right. As shown by the more uniform patterns, there is reduction of interference patterns, which cleans up the beam significantly. Improved blocking of substrate light may further reduce interference on the substrate side of the beam.

FIGS. 10 and 11 are simplified diagrams of far field traces of green laser devices with and without laser scribes according to embodiments of the present invention. As shown, the lighter-colored trace represents the substrate direction and the darker-colored trace represents the perpendicular direction. As shown, the substrate interference appears as peaks to the left and right of the beam and interference fringes. The lighter-colored trace represents the far-field profile in the substrate direction (where negative angles are towards the substrate) and the darker-colored trace represents the direction perpendicular to the lighter-colored trace. Referring now to FIG. 11, which includes the scribe structures, substrate peaks are reduced and interference fringes remain on the substrate side. Additional results for blue lasers can be found throughout the present specification and more particularly below.

FIGS. 12 and 13 are diagrams of near field images of blue laser devices with and without laser scribes according to embodiments of the present invention. As shown in FIG. 12, the images were taken by focusing the laser structures onto a CCD camera. The CCD camera was Ocean Optics, Inc., which captures the laser structure and intensity of light derived from the laser structures. As shown, the intensity plots are on log scale (so the substrate light can be seen in a desirable manner). Also, measured power in the substrate as a fraction of the total output power is shown in white characters. The periodic bright spots are an artifact of saturation of the CCD camera and are not significant. As shown, the fraction of total power lost was about 17.1%, although there were slight variations, for the blue laser devices without the laser scribes according to the present invention. Referring now to FIG. 13, which includes the laser scribes, as shown, laser scribes block the light underneath the ridge, which reduce the fraction of light lost from the laser structures. As shown, a large amount of substrate light is right underneath the ridge so much of the substrate light is blocked. The scribe structures were configured in the manner described herein. As shown, the loss averaged 2.6%, which is significantly better than the example without the laser scribe.

FIGS. 14 and 15 are simplified diagrams of far field images of blue laser devices with and without laser scribes according to embodiments of the present invention. As shown, each of the images are projected on the screen and image captured thereon. The amount of light in the substrate correlates with the strength of the interference pattern, as shown. The substrate of the laser is oriented to the right, as shown. Referring now to FIG. 15, which includes the scribe structures, the substrate of the laser is oriented to the right. As shown by the more uniform patterns, there is reduction of interference patterns, which cleans up the beam significantly. Improved blocking of substrate light may further reduce interference on the substrate side of the beam.

FIGS. 16 and 17 are diagrams of far field traces of blue laser devices with and without laser scribes according to embodiments of the present invention. As shown, the lighter-colored trace represents the substrate direction and the darker-colored trace represents the perpendicular direction. As shown, the substrate interference appears as peaks to the left and right of the beam and interference fringes. The lighter-colored trace represents the far-field profile in the substrate direction (where negative angles are towards the substrate) and blue the darker-colored trace represents the direction perpendicular to the lighter-colored trace. Referring now to FIG. 17, which includes the scribe structures, the peaks are reduced and interference fringes remain on the substrate side.

While the above is a full description of the specific embodiments, various modifications, alternative constructions and equivalents may be used. As an example, the packaged device can include any combination of elements described above, as well as outside of the present specification. In other embodiments, the present specification describes one or more specific gallium and nitrogen containing surface orientations, but it would be recognized that any one of a plurality of family of plane orientations can be used. Therefore, the above description and illustrations should not be taken as limiting the scope of the present invention which is defined by the appended claims.

What is claimed is:

1. An optical device comprising:
    a substrate having a front side and a back side, the substrate including gallium material;
    an active region including at least one quantum well overlying the front side of the substrate;
    a cavity overlying the active region, the cavity having a length and a width; and
    a plurality of trenches provided on the back side of the substrate, at least a portion of each of the plurality of trenches extending under the cavity, the portion under the cavity extending non-parallel to the length of the cavity.

2. The device of claim 1 wherein the plurality of trenches extend across a width of the substrate and are configured to reduce a stray leakage light from the front surface of the substrate; and reduce an interference pattern of the leakage light.

3. The device of claim 1 wherein:
    the plurality of trenches is characterized by a length of about 30 to 100 um; and
    the substrate is characterized by a width of about 50 to 500 um.

4. The device of claim 1 wherein the length of the cavity is substantially parallel to a c-direction.

5. The device of claim 1 wherein the substrate is characterized by a nonpolar orientation and the length of the cavity is substantially parallel to a c-direction.

6. The device of claim 1 wherein the substrate is characterized by a semi-polar orientation and the length of the cavity is substantially parallel to the projection of the c-direction.

7. The device of claim 1 wherein the plurality of trenches is characterized by a depth of at least 5 microns below the top side of the substrate.

8. The device of claim 1 wherein the plurality of trenches is characterized by a depth of at least 40 microns below the top side of the substrate.

9. The device of claim 1 wherein the plurality of trenches are oriented substantially perpendicular to the length of the cavity.

10. The device of claim 1 wherein the plurality of trenches are oriented at an angle of about 30 to 60 degrees to the length of the cavity.

11. The device of claim 1 wherein the plurality of trenches are substantially straight lines and are parallel to one another.

12. The device of claim 1 wherein:
the substrate is characterized by a thickness of at least 50 microns; and
the plurality of trenches are characterized by a depth of at least 5 microns less than the thickness of the substrate.

13. The device of claim 1 wherein:
the substrate is characterized by a thickness of at least 50 microns; and
the plurality of trenches are characterized by a depth of at least 10 microns less than the thickness of the substrate.

14. The device of claim 1 wherein the plurality of trenches are characterized by a width of about 0.1 to 10 microns.

15. The device of claim 1 wherein the substrate is characterized by a non-polar or semi-polar orientation.

16. The device of claim 1 wherein a laser diode fabricated on the substrate has an operational wavelength in the green wavelength regime of about 500-540 nm.

17. The device of claim 1 wherein a laser diode fabricated on the substrate has an operational wavelength in the blue wavelength regime of about 430-480 nm.

18. The device of claim 1 wherein a laser diode fabricated on the substrate has an operational wavelength in the violet wavelength regime of about 390-430 nm.

19. An optical device comprising:
a gallium and nitrogen containing substrate, the substrate including a front side and a back side, the back side including a plurality of trench structures each having at least a portion that extends substantially straight, the plurality of trench structures being characterized by a first direction, the plurality of trench structures being configured to reduce a leakage light from the front surface of the substrate;
a laser stripe region formed overlying a portion of the substrate, the laser stripe region being characterized by a cavity orientation non-parallel to the first direction, the laser stripe region having a first end and a second end;
a first facet provided on the first end of the laser stripe region; and
a second facet provided on the second end of the laser stripe region.

* * * * *